United States Patent [19]
Kawashima

[11] Patent Number: 6,023,320
[45] Date of Patent: *Feb. 8, 2000

[54] SCANNING EXPOSURE APPARATUS WITH SURFACE POSITION DETECTING SYSTEM

[75] Inventor: Haruna Kawashima, Utsunomiya, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/872,341

[22] Filed: Jun. 10, 1997

[30] Foreign Application Priority Data

Jun. 13, 1996 [JP] Japan ................................ 8-174339
Apr. 30, 1997 [JP] Japan ................................ 9-126338

[51] Int. Cl.[7] .................................................. G03B 27/42
[52] U.S. Cl. .............................. 355/53; 355/55; 356/400; 356/401
[58] Field of Search ........................ 355/53, 55; 356/375, 356/399, 400, 401; 250/559.29, 559.3, 548

[56] References Cited

U.S. PATENT DOCUMENTS

| | | | |
|---|---|---|---|
| 5,118,957 | 6/1992 | Kawashima et al. | 250/561 |
| 5,124,562 | 6/1992 | Kawashima et al. | 250/548 |
| 5,194,893 | 3/1993 | Nishi | 355/53 |
| 5,323,016 | 6/1994 | Yamada et al. | 250/561 |
| 5,414,515 | 5/1995 | Kawashima | 356/371 |
| 5,640,227 | 6/1997 | Kato et al. | 355/53 |
| 5,646,413 | 7/1997 | Nishi | 356/401 |

FOREIGN PATENT DOCUMENTS 6-52706  2/1994  Japan.

*Primary Examiner*—Alan A. Mathews
*Attorney, Agent, or Firm*—Fitzpatrick, Cella, Harper & Scinto

[57] ABSTRACT

A scanning exposure apparatus, wherein a pattern of a surface of a first object placed on a first stage is illuminated with exposure light from a slit aperture of an illumination system, and wherein the pattern of the first object is projected through a projection optical system onto a surface of a second object placed on a second stage while relatively and scanningly moving the first and second stages in a widthwise direction of the slit aperture, in a timed relation and at a speed ratio corresponding to a projection magnification of the projection optical system. The apparatus includes a reference plate provided in a portion of one of the first and second stages and having a predetermined mark, a reflection surface plate provided in a portion of the other of the first and second stages, and a surface position detecting system for projecting the mark of the reference plate onto the reflection surface plate through the projection optical system and, while moving one of the first and second stages in a direction of an optical axis, for detecting the position of the surface of the second object in the direction of the optical axis on the basis of an image reflected by the reflection surface plate.

16 Claims, 19 Drawing Sheets

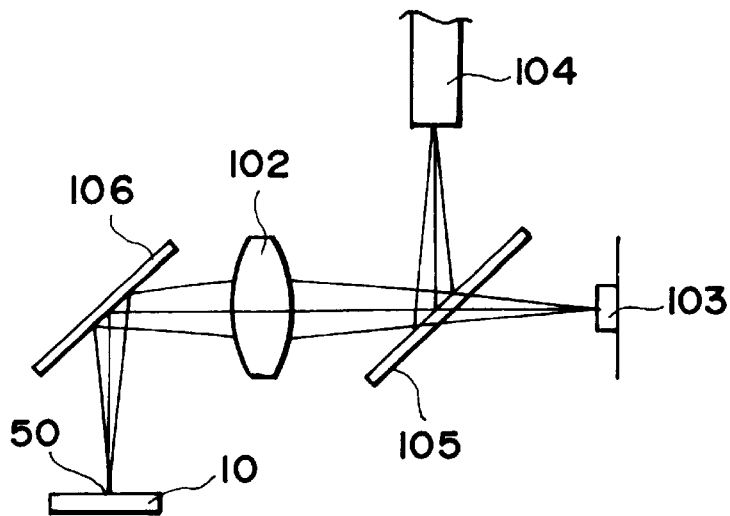
F I G. 3
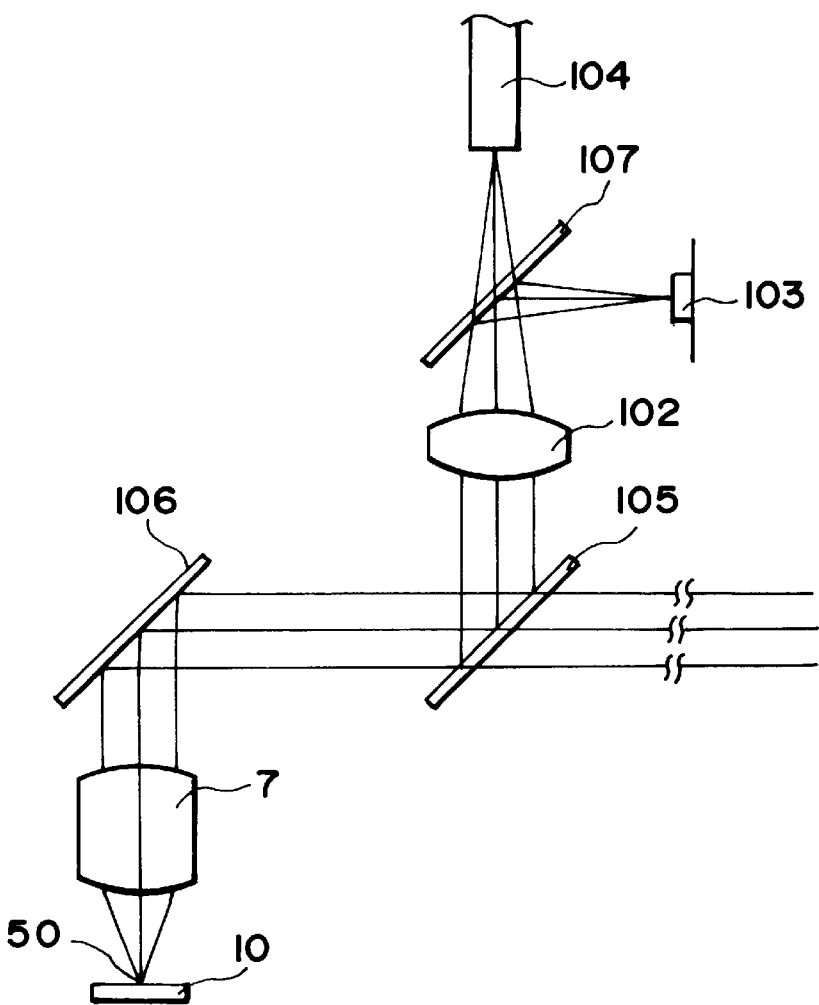
F I G. 4

SCANNING EXPOSURE APPARATUS WITH SURFACE POSITION DETECTING SYSTEM

FIELD OF THE INVENTION AND RELATED ART

This invention relates to a scanning exposure apparatus with a surface position detecting system which is particularly suitable for use in the manufacture of high-precision devices, for example, for projecting through a projection lens (projection optical system) a fine electronic circuit pattern such as an IC or LSI formed on the surface of a reticle (mask) onto the surface of a wafer to print the pattern thereon, wherein in such an exposure process the surface position information of the wafer surface with respect to a direction of an optical axis of the projection lens and the wafer is positioned upon a best imaging plane of the projection optical system.

In reduction projection type exposure apparatuses for the manufacture of semiconductor devices, a circuit pattern of a reticle (first object) is projected onto a wafer (second object) through a projection lens system. Prior to such projection exposure, a surface position detecting system is used to detect the position of the wafer surface with respect to a direction of an optical axis, and the wafer surface is then brought into registration with the best imaging plane of the projection lens.

In many cases, surface position detecting systems are of an oblique light projection type wherein input light is projected obliquely to the surface of a semiconductor wafer, disposed at a position where a mask pattern is to be transferred by a projection lens, and wherein, by detecting reflection light obliquely reflected from the semiconductor wafer surface, the surface position of the wafer is detected.

On the other hand, many proposals have been recently made with regard to step-and-scan type scanning projection exposure apparatuses by which enlargement of the picture plane size (frame size) is enabled. In such a scanning exposure apparatus, a pattern on the surface of a reticle is illuminated with slit-like light, and the pattern illuminated with the slit-like light is projected and printed on a wafer with a projection system (projection optical system) and with a scan motion.

Generally, in a projection exposure apparatus, enhancement of resolving power is accompanied by a decrease in the depth of focus of a projection optical system. Thus, for a higher projection resolution, it is an important factor to place the wafer surface at a correct position with respect to the optical axis direction of a projection optical system.

As regards a surface position detecting system for a wafer surface for use in exposure apparatuses, generally an off-axis detection mechanism arranged obliquely to the wafer surface, as described before, is used. In projection type exposure apparatuses, a projection optical system is likely to absorb heat in the progress of an exposure process, or it is affected by a change in an environmental condition such as a variation of pressure, for example, This causes a change in the focal point position of the projection optical system.

If it occurs, then, in the off-axis surface position detecting mechanism of oblique projection type as described, a focal plane error with respect to the measurement origin results. Many exposure apparatuses are therefore equipped with a mechanism for calibration of such error.

Japanese Published Patent Application, Publication No. 52706/1994, filed by the same assignee of the subject application, proposes an exposure apparatus which uses a "self-conjugation method" for a calibration mechanism. Here, the "self-conjugation" refers to a state in which an image of a pattern of a first object (e.g., a reticle) is projected onto a reflective surface of a second object (e.g., a wafer stage) through a projection optical system and in which reflected light is collected back to the pattern of the first object again through the projection optical system. The "self-conjugation method" is to perform calibration with an off-axis surface position detecting mechanism, on the basis of a phenomenon that, in the detection of the light quantity of reflected light passing the pattern in that state, the detected light quantity becomes maximum when the reflection surface of the second object is positioned on the imaging plane of the projection optical system.

Another calibration mechanism known in the art uses a microscope provided in a projection exposure apparatus, for a TTL type alignment procedure, to measure sharpness of an image of a mark formed on a wafer stage (second object), through a transmissive portion of a reticle (first object) and through a projection optical system (TTL) and to detect the best imaging plane of the projection optical system, for calibration of an off-axis surface position detecting mechanism.

This mechanism needs the use of a transmissive portion of a reticle, for observation of a mark on a wafer stage, and usually such a transmissive portion is defined in a region outside an exposure region of the reticle.

Calibration based on the "self-conjugation method" is marked by good calibration precision with a relatively simple structure.

An alternative method which uses the "self-calibration method" may use detecting means for detecting a light quantity of reflected light, disposed within a microscope for reticle surface observation, wherein calibration may be performed by using an exposure pattern (transfer pattern) of the reticle itself. In such a method, however, it is not assured that an exposure pattern suitable for calibration is always present within the range of observation with the microscope. Therefore, this method involves a problem that it is not attainable to detect the best imaging position with respect to different points within the exposure region of the projection optical system and to produce information regarding the whole of the imaging plane of the projection optical system.

Further, with the method in which a microscope for reticle surface observation is used to measure the sharpness of the image of the mark formed on the wafer stage, it is necessary to provide the reticle with a transmissive portion for observation of the mark on the wafer stage. However, since it is not assured that a transmissive portion for wafer stage mark observation is always present within the range of observation of the microscope, this method involves a similar problem that it is not attainable to detect the information regarding the whole of the imaging plane.

If an exclusive pattern (or transmissive portion) is defined within an exposure region on the reticle, then it may be attainable to detect the best imaging position with respect to different positions within the exposure region of the projection optical system and thus to detect the information regarding the whole of the imaging plane of the projection optical system. With this method, however, plural patterns other than the circuit pattern have to be formed inside the exposure region. Therefore, the degree of freedom in the design of the circuit pattern is considerably restricted.

Further, if an exclusive pattern is defined inside the exposure region, the microscope has to be retracted out of the exposure region during the circuit pattern exposure process. It, therefore, causes a problem of reduced throughput.

Additionally, when such an exclusive pattern is used, there is a practical problem that calibration cannot be performed unless all reticles used for the exposure process are equipped with exclusive patterns.

SUMMARY OF THE INVENTION

It is an object of the present invention to provide a unique and improved scanning exposure apparatus.

In accordance with an aspect of the present invention, there is provided a scanning exposure apparatus, wherein a pattern of a surface of a first object placed on a first stage is illuminated with exposure light from a slit aperture of illumination means, and wherein the pattern of the first object is projected through a projection optical system onto a surface of a second object placed on a second stage while relatively and scanningly moving said first and second stages in a widthwise direction of the slit aperture, in a timed relation and at a speed ratio corresponding to a projection magnification of said projection optical system, said apparatus comprising: a reference plate provided in a portion of one of said first and second stages and having a predetermined mark; a reflection surface plate provided in a portion of the other of said first and second stages, without said reference plate; and a surface position detecting system for projecting the mark of said reference plate onto said reflection surface plate through said projection optical system and, while moving one of said first and second stages in a direction of an optical axis, for detecting the position of the surface of, the second object in the direction of the optical axis on the basis of an image reflected by said reflection surface plate.

In one preferred form of this aspect of the present invention, said apparatus is provided with a plurality of reference plates each as aforesaid, which are disposed in a scan direction of the first object on said first stage, and wherein said surface position detecting system detects the surface position of the second object in the optical axis direction on the basis of a reference plate, of said plural reference plates, closer to the optical axis of said projection optical system.

In another preferred form of this aspect of the present invention, said reference plate is formed with plural marks for surface position detection, which are disposed in a direction perpendicular to the scan direction.

In a further preferred form of this aspect of the present invention, said apparatus is provided with a plurality of reflection surface plates each as aforesaid, and wherein said position detecting system detects the surface position of the second object on the basis of a reflection surface plate, of said plural reflection surface plates, closer to the optical axis of said projection optical system.

In a still further preferred form of this aspect of the present invention, said reflection surface plate is disposed in a portion of said second stage, and wherein said reflection surface plate has a length in a direction perpendicular to the scan direction, which is larger than a diameter of the surface of the second object on said second stage.

In a yet further preferred form of this aspect of the present invention, the apparatus further comprises an off-axis surface position detecting system in which a pattern is projected, obliquely onto the surface of the second object, by means of a light projecting system and without use of said projection optical system, in which an image of the pattern formed on the surface of the second object is re-imaged by means of a light receiving system upon a surface of a light receiving element, and in which positional information related to the surface of the second object with respect to the optical axis direction is detected on the basis of a positional signal related to the image of the pattern re-imaged on said light receiving element surface, wherein said off-axis surface position detecting system performs calibration on the basis of data obtainable with the first-mentioned surface position detecting system.

In accordance with another aspect of the present invention, there is provided a scanning exposure apparatus, wherein a pattern of a surface of a first object placed on a first stage is illuminated with exposure light from a slit aperture of illumination means, and wherein the pattern of the first object is projected through a projection optical system onto a surface of a second object placed on a second stage while relatively and scanningly moving said first and second stages in a widthwise direction of the slit aperture, in a timed relation and at a speed ratio corresponding to a projection magnification of said projection optical system, said apparatus comprising: a reflection plate provided in a portion of one of said first and second stages and having a predetermined mark; a reference surface plate provided in a portion of the other of said first and second stages, without said reflection plate; and a surface position detecting system for observing the mark of said reflection plate through said projection optical system and through a transmissive portion of said reference plate, and, while moving one of said first and second stages in a direction of an optical axis, for detecting the position of the surface of the second object in the direction of the optical axis on the basis of an image of the mark of said reflection plate.

In one preferred form of this aspect of the present invention, said apparatus is provided with a plurality of reference plates each as aforesaid, which are disposed in a scan direction of the first object on said first stage, and wherein said surface position detecting system detects the surface position of the second object in the optical axis direction on the basis of a reference plate, of said plural reference plates, closer to the optical axis of said projection optical system.

In another preferred form of this aspect of the present invention, said reference plate is formed with plural marks for surface position detection, which are disposed in a direction perpendicular to the scan direction.

In a further preferred form of this aspect of the present invention, said apparatus is provided with a plurality of reflection plates each as aforesaid, and wherein said position detecting system detects the surface position of the second object on the basis of a reflection plate, of said plural reflection plates, closer to the optical axis of said projection optical system.

In a still further preferred form of this aspect of the present invention, said reflection plate is disposed in a portion of said second stage, and wherein said reflection plate has a length in a direction perpendicular to the scan direction, which is larger than a diameter of the surface of the second object on said second stage.

In a yet further preferred form of this aspect of the present invention, the apparatus further comprises an off-axis surface position detecting system in which a pattern is projected, obliquely onto the surface of the second object, by means of a light projecting system and without use of said projection optical system, in which an image of the pattern formed on the surface of the second object is re-imaged by means of a light receiving system upon a surface of a light receiving element, and in which positional information related to the surface of the second object with respect to the optical axis direction is detected on the basis of a positional signal related to the image of the pattern re-imaged on said light receiving element surface, wherein said off-axis surface position detecting system performs calibration on the basis of data obtainable with the first-mentioned surface position detecting system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic view of a portion of a scanning exposure apparatus according to another embodiment of the present invention.

FIG. 4 is a schematic view of a portion of a scanning exposure apparatus according to a further embodiment of the present invention.

DESCRIPTION OF THE PREFERRED EMBODIMENTS

Figure 1:
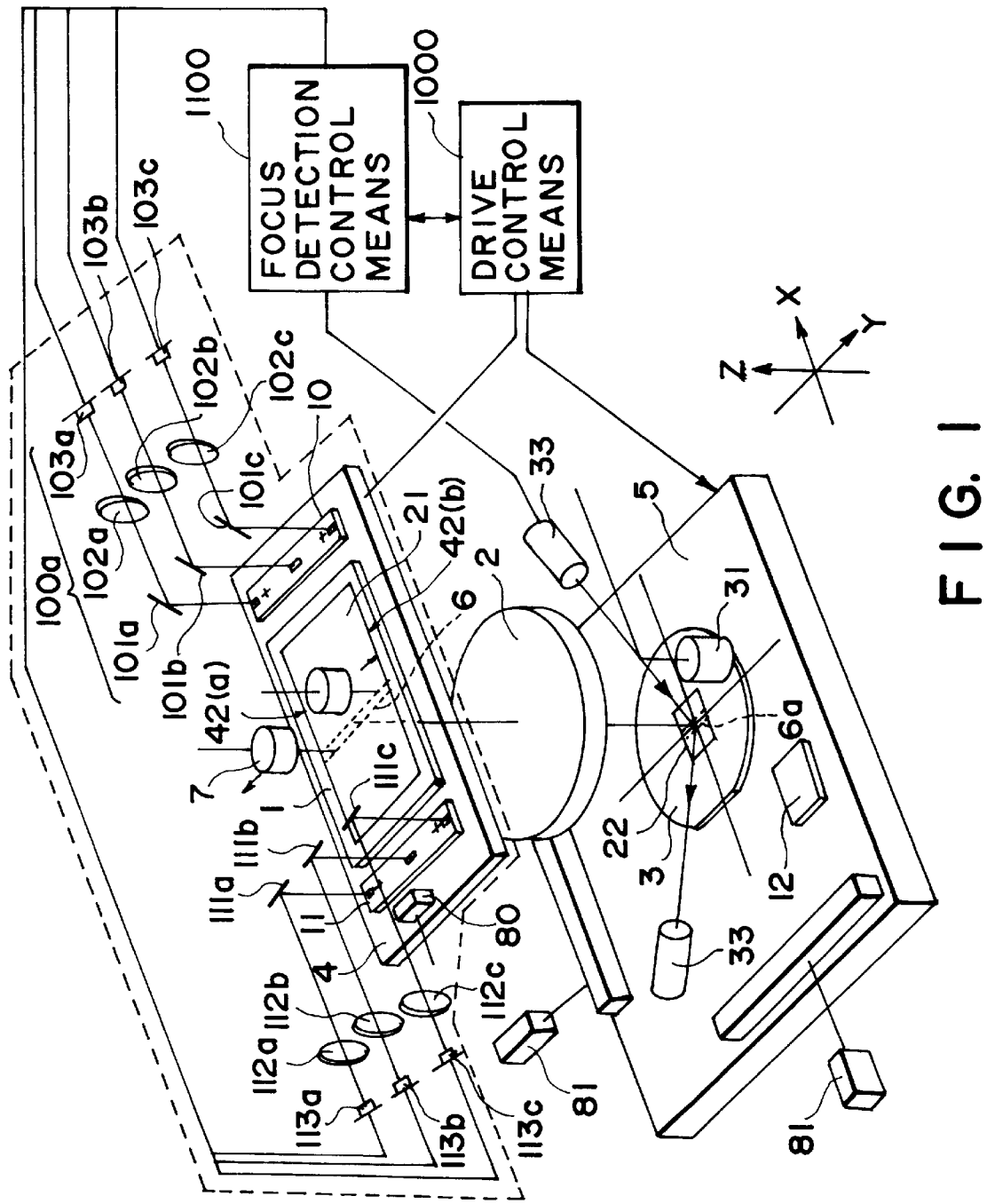
FIG. 1 is a schematic and diagrammatic view of a main portion of a scanning exposure apparatus according to an embodiment of the present invention.

FIG. 1 is a schematic and diagrammatic view of a first embodiment of the present invention wherein a surface position detecting system is incorporated into a step-and-scan type projection exposure apparatus for the manufacture of microdevices.

Figure 2:
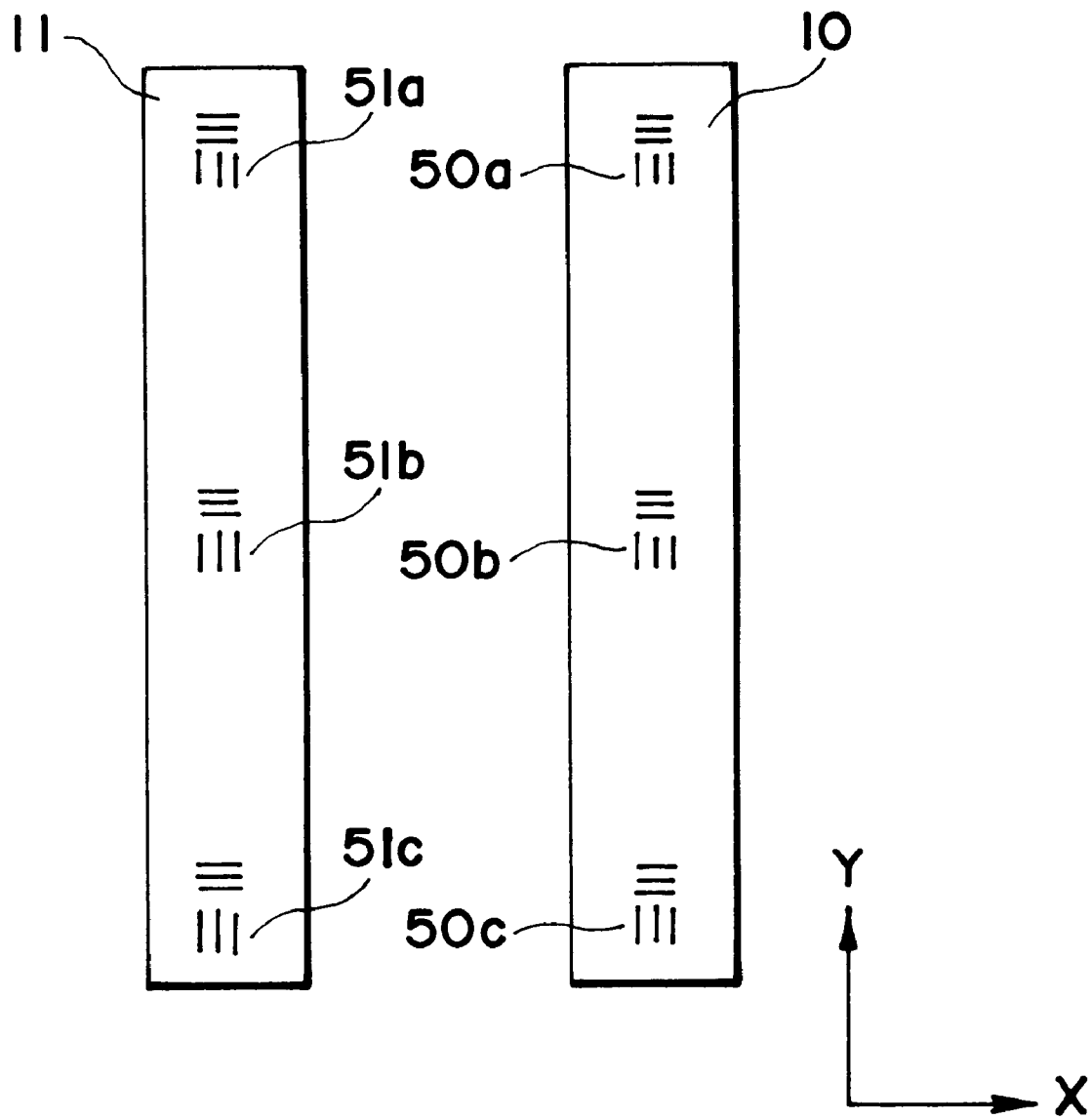
FIG. 2 is an enlarged view of a portion of FIG. 1.

FIG. 2 is an enlarged view of a portion of FIG. 1. This embodiment is applied to a scanning exposure apparatus wherein exposure light emitted by a light source of a pulse laser is projected to a reticle (first object) 1 by an illumination optical system (illumination means) and in the form of light 6 of a slit-like shape, and a circuit pattern formed on the reticle 1 is scanningly projected by a projection lens (projection optical system) 2, in a reduced scale, onto a wafer (second object) 3 which is coated with a photosensitive material.

In this form of the present invention, the invention is similarly applicable to a usual step-and-repeat type projection exposure apparatus.

In FIG. 1, a reticle 1 formed with a circuit pattern is placed on a reticle stage (first stage) 4 which is drive controlled in the X direction by a laser interferometer 81 and drive control means 1000. The reticle stage 4 is driven in the X direction while the position thereof with respect to the Z direction is held fixed with respect to the projection optical system 2.

The wafer 3 which is a photosensitive substrate is placed on a wafer stage (second stage) 5 which is drive controlled in the X and Y directions by the laser interferometer 81 and the drive control means 1000. Additionally, the position of the wafer stage 5 in the Z direction as well as the tilt thereof can be drive controlled with respect to the projection optical system 2.

The reticle 1 and the wafer 3 are disposed at positions which are optically conjugate with each other with respect to the projection optical system 2, and, by means of an illumination system (not shown), exposure light 6 of a slit-like shape, elongated in the Y direction, is defined on the reticle 1. The exposure light upon the reticle 1 is then projected on the wafer 3 as slit-like exposure light 6a of a size proportional to the projection magnification of the projection optical system 2.

In the reduction projection exposure of the scan type, both of the reticle stage 4 and the wafer stage 5 are moved in the X direction, relative to this slit-like exposure light 6 and exposure light 6a, at a speed ratio corresponding to the optical magnification of the projection optical system 2. As a result, a pattern transfer region 21 on the reticle 1 and a pattern transfer region 22 on the wafer 3 are scanned with the exposure lights 6 and 6a, whereby scanning exposure is performed. Denoted at 7 is a microscope for observation of the reticle 1 surface.

The surface position detecting system of this embodiment includes a TTL surface position detecting system which is arranged to detect surface position information related to the position of the wafer 3 surface in the optical axis direction (Z direction), by using plates 10 and 11 provided on the reticle stage 4. On the basis of the the result of detection, the wafer stage 5 is moved by the drive control means 1000 so that the wafer 3 is brought into registration with the best imaging plane of the projection optical system 2.

The surface position detecting system of this embodiment will be explained below, in more detail.

Denoted at 10 and 11 are plates (reference plates), such as illustrated in FIG. 2. Marks 50 (50a, 50b, 50c) and 51 (51a, 51b, 51c) are formed on the surfaces of these plates. The marks 50 and 51 are formed at the same position with respect to the optical axis direction with the circuit pattern of the reticle 1. The plates 10 and 11 are mounted on the reticle stage 4.

In this embodiment, it is not always necessary to use two plates 10 and 11. Only one of them may be used. The mark 50 or 51 may be provided by a structure of a line and space formed on a glass substrate by Cr deposition, for example, and having transmissive portions. As shown in FIG. 2, these marks are defined at different positions 50a–50c and 51a–41c upon the plates 10 and 11, with respect to the Y direction. By disposing marks at different positions upon the plates 10 and 11, any change in image plane of the projection optical system in the lengthwise direction (Y direction) of the slit can be detected.

Further, as shown in FIG. 1, disposed above the three marks (50a–50c; 51a–51c) of the plate 10 or 11 are half mirrors 101a–101c and 111a–111c, condensing lenses 102a–102c and 112a–112c, and light receiving elements 103a–103c and 113a–113c, which are operationally associated with the marks, respectively. Here, one half mirror (e.g., 110a), one condensing lens (e.g., 102a) and one light receiving element (e.g. 103a), constitute one light receiving system 100a.

Six light receiving systems 10a–100c and 110a–110c are thus provided, and they are mounted on the reticle stage 4. Thus, when the reticle stage 4 is moved in the X direction by the drive control means 1000, these light receiving systems move as a unit with the reticle stage 4. In FIG. 1, the range of components movable as a unit with the reticle stage 4 is illustrated with a broken line.

On the other hand, a reflection surface plate 12 is mounted on the wafer stage 5. The surface of this reflection surface plate 12 is set at substantially the same level (height) as the surface of the wafer 3. The surface position of the wafer 3 with respect to the optical axis of the projection optical system 2 is detected by a surface position detecting mechanism (off-axis surface position detecting system) 33 which is based on an off-axis oblique projection method. The surface position detecting mechanism 33 is operable to detect the position with respect to Z direction as well as tilt.

In the surface position detecting mechanism 33 comprising an off-axis surface position detecting system, as an example a light projecting system projects a pattern or light spot upon the surface of a wafer, and the pattern or light spot formed on the wafer surface is projected on to the surface of a sensor of a light receiving system. Since the positional information of it upon the sensor surface is in a predetermined relation with the position of the wafer surface with respect to the optical axis direction, the surface position of the wafer with respect to the optical axis direction can be detected by detecting the positional information upon the sensor surface.

Next, a description will be made of a correction (calibration) for an error between a change in focal point position of a projection optical system resulting from a change in environmental conditions, for example, and a change in surface position data obtainable through the surface position detecting mechanism 33, the correction being made on the basis of data obtainable through the TTL surface position detecting system.

Figure 6:
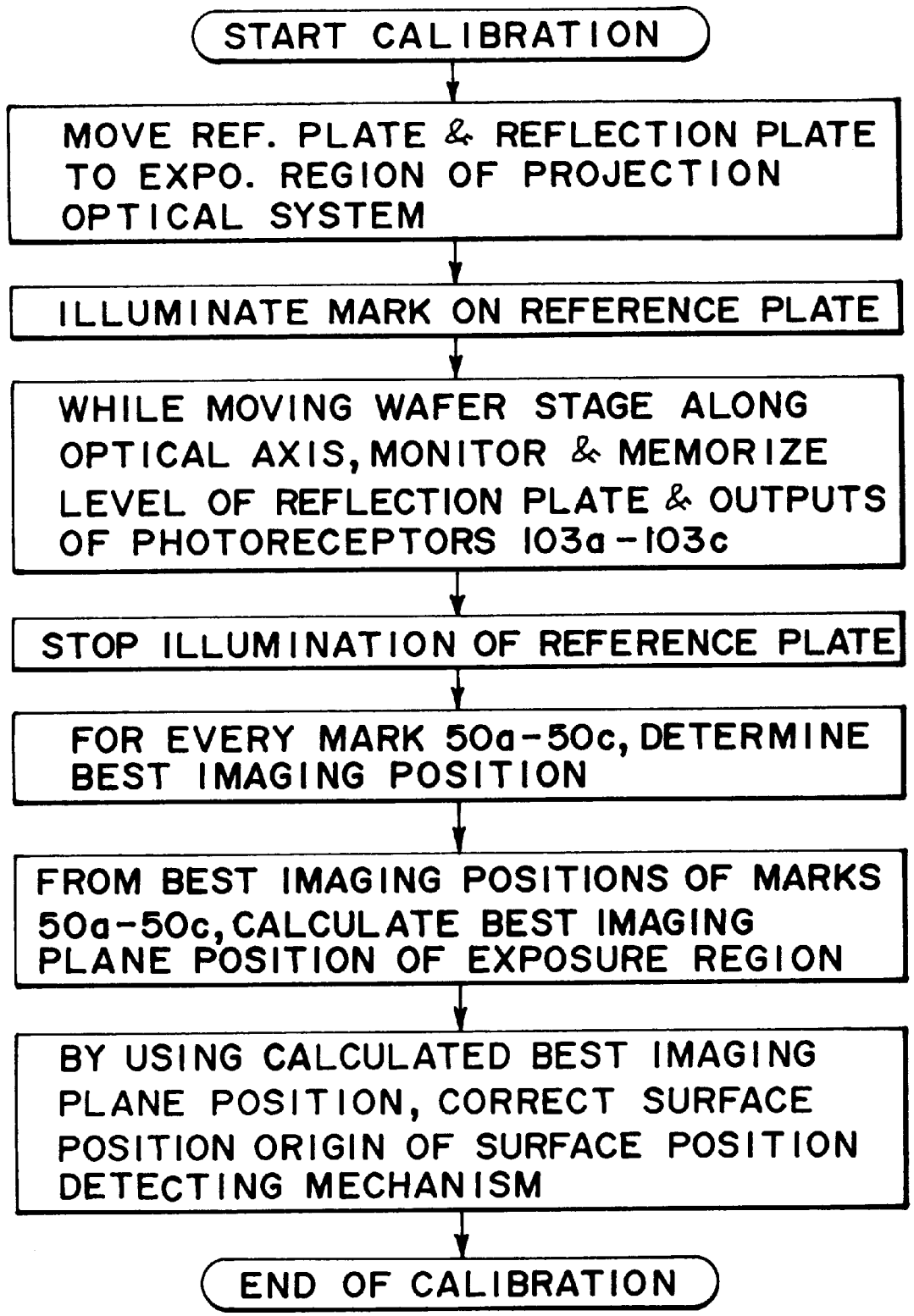
FIG. 6 is a flow chart for explaining operation in accordance with an embodiment of the present invention.

FIG. 6 is a flow chart of calibration in this embodiment. The calibration may be made by using either the mark 50 of the plate 10 or the mark 51 of the plate 11. The case wherein the mark 50 of the plate 10 is used will be explained below.

First, the drive control means 1000 moves the reticle stage 4 and the wafer stage 5 so that the plate 10 of the reticle stage 4 and the reflection surface plate 12 of the wafer stage 5 are brought into alignment with the optical axis. Here, the mark 50 (50a–50c) of the plate 10 is placed inside a region to be illuminated with the slit-like exposure light 6.

An illumination system (not shown) then illuminates the mark 50 on the plate by way of the half mirror 101 (101a–101c). Here, the illumination light may comprise the same exposure light to be used for lithographically printing the pattern of the reticle 1 on the wafer 3, or it may comprise light different from the exposure light.

The light passing the mark 50 goes through the projection optical system 2 and, after that, it is collected on the reflection surface plate 12 and is reflected thereby. The light reflected by the reflection surface plate 12 goes again through the projection optical system 2 and is collected on the mark 50. Here, a portion of the light passes the mark 50 and is reflected by the half mirror 101 and, after that, it passes through the condensing lens 102 and is received by the light receiving element 103 (103a–103c).

While holding this state and keeping the tilt of the reflection surface plate 12 of the wafer stage 5 constant, the drive control means 1000 moves the wafer stage 5 in the Z direction (optical axis direction), across the position expected as the focal plane of the projection optical system 2. The Z-axis driving position of the wafer stage 5 is monitored by the surface position detecting mechanism 33, and it is stored into focal point position detection control means 1100. Here, a photoelectric conversion output of the light receiving element 103 also is monitored, and it is memorized in the focal point position detection control means 1100.

From the light receiving element 103 (103a–103c), an output corresponding to the mark 50 (50a–50c) on the plate 10 is produced. The position in the Z direction where the photoelectric conversion output of the light receiving element 103 becomes maximum, corresponds to the best imaging position for each mark 50 (50a–50c).

Thus, the focal point position detection control means 1100 determines best imaging positions for the marks 50a–50c, and performs calculation of the best imaging position while taking into account the tilt of the slit-like exposure region 6a.

By using the thus determined best imaging position, the origin of yhe surface position of the surface position detecting mechanism 33 is corrected, and it is stored into the focal point position detection control means 1100. In this manner, calibration for the image plane position of the projection optical system 2 and the surface position to be detected by the surface position detecting mechanism 33 is performed. After completion of calibration, projection of exposure light of the illumination system is stopped.

During the process of pattern transfer, the focal point position detection control means 1100 operates to bring the surface position of the exposure region 22 of the wafer 3 into registration with the surface position information of the surface position detecting mechanism 33 as calibrated. In the procedure after that, the surface position information of the wafer 3 is detected by means of the surface position detecting mechanism 33, and step-and-scan projection exposure is performed on the basis of the result of the detection.

As regards the timing of calibration, calibration may be done during sequential operation of pattern transfer to the wafer 3 or, alternatively, it may be done separately from the pattern transfer operation. Either mark 50 or mark 51 may be used for the calibration. However, since the position of the reticle stage at the moment at which calibration is just about to be done may not always be at the drive center in the X direction, the use of such a mark that needs a smaller amount of X-direction movement of the reticle stage 4, that is, the use of one of the marks closer to the optical axis of the projection optical system for the calibration may be desirable in the point of improved throughput. This is for the reason that, because of reduction projection, the amount of movement of the reticle stage 4 is larger than that of the wafer stage 5 by an amount corresponding to the magnification and, thus, the time for movement thereof is longer accordingly.

Figure 10:
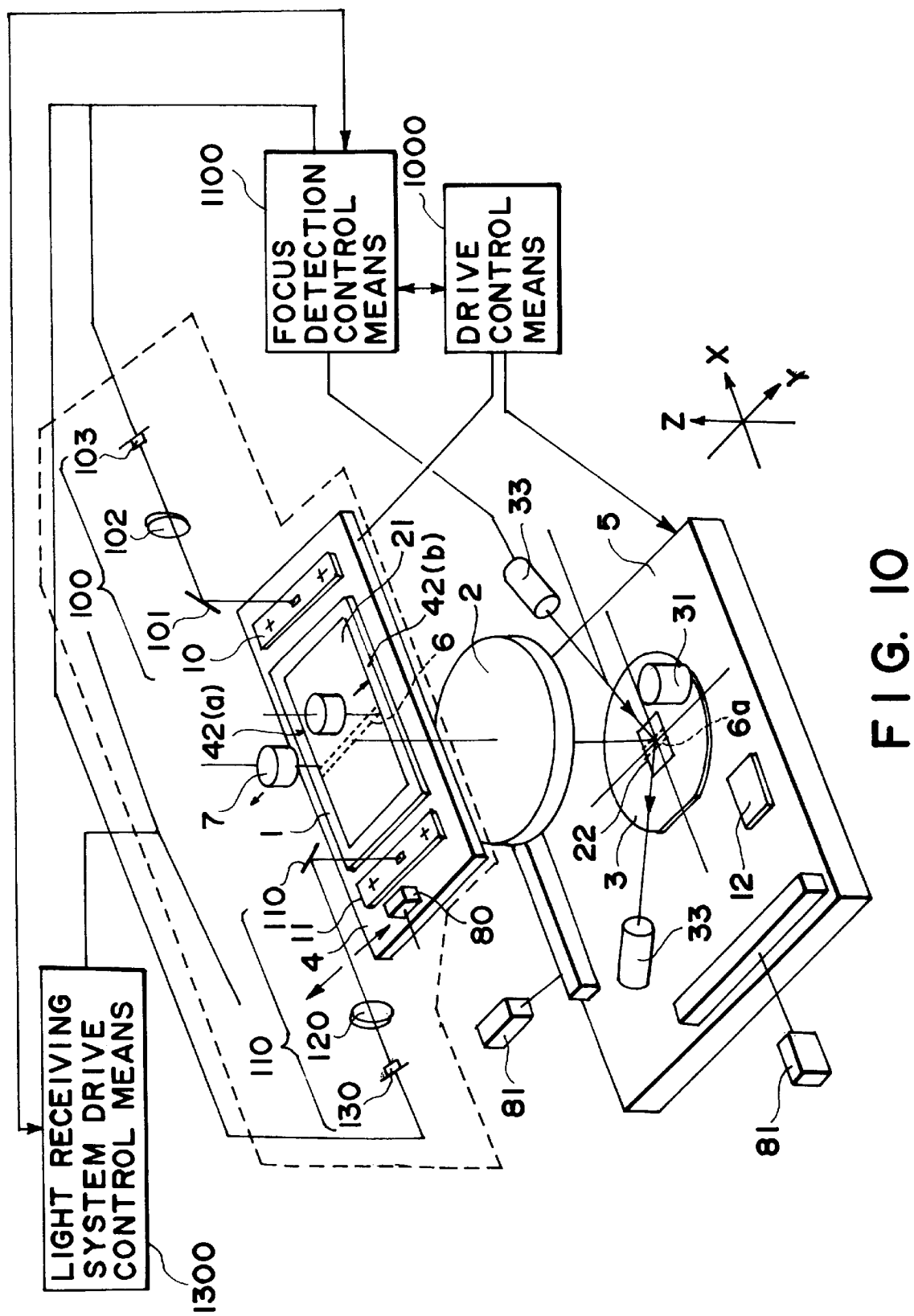
FIG. 10 is a schematic and diagrammatic view of a scanning exposure apparatus according to a still further embodiment of the present invention.

Next, a second embodiment of the present invention will be explained. The first embodiment described with reference to FIG. 1 uses six light receiving systems for receiving lights from the marks 50 (50*a*–50*c*) and 51 (51*a*–51*c*) on the plates 10 and 11. In the present embodiment, as compared, only a single light receiving system 100 or 110 is provided for each of the plates 10 and 11, as shown in FIG. 10. These light receiving systems 100 and 110 are moved by light receiving system drive control means 1300, while being opposed to the marks 50*a*–50*c* and 51*a*–51*c*, in the Y direction as denoted by an arrow in the drawing, and best imaging positions with respect to these marks 50*a*–50*c* and 51*a*–51*c* are detected.

Figure 7:
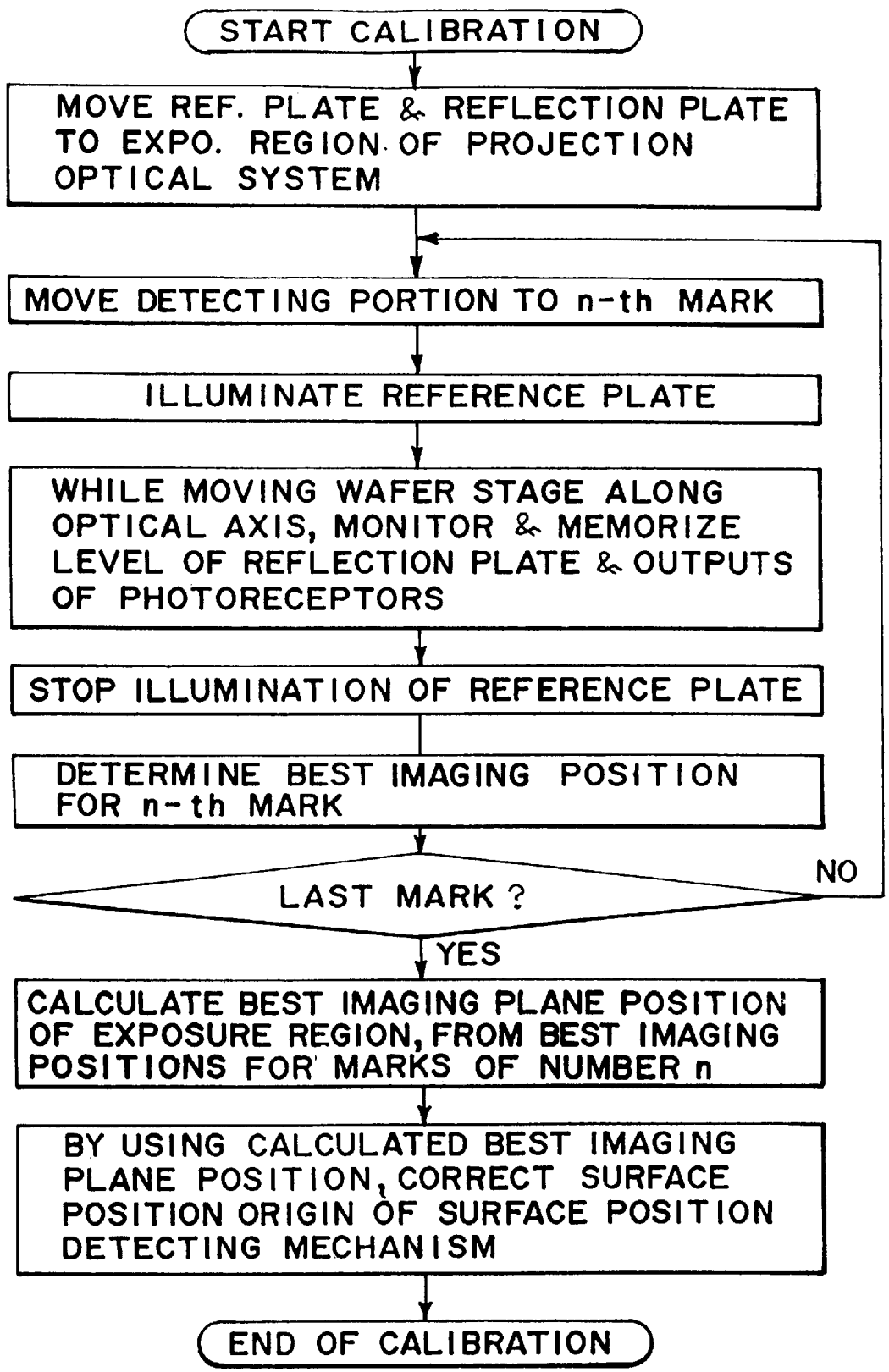
FIG. 7 is a flow chart for explaining operation in accordance with another embodiment of the present invention.

FIG. 7 is a flow chart of the calibration process of this embodiment.

A third embodiment of the present invention will now be explained. FIG. 3 is a schematic view of a portion of a scanning exposure apparatus according to the third embodiment. This embodiment differs from the first embodiment in that a mark of a plate 10 is illuminated with light guided by a fiber 104. The remaining portion of this embodiment is of substantially the same structure as that of the first embodiment.

In FIG. 3, light projected by the fiber 104 is reflected by a half mirror 105 and, after passing a condensing lens 102, it is reflected and deflected by a mirror 106. The reflected light then illuminates a mark 50 formed on the plate 10. Then, the light passes a projection optical system 2 and is projected on a reflection plate 12 provided on a wafer stage 5. The light reflected by the reflection plate 12 passes through the mark 50 and is reflected and deflected by the mirror 106. It goes through the condensing lens 102 and passes through the half mirror 105, and it is received by a light receiving element 103. Substantially the same structure is provided for the mark 51 side of another plate 11. The wavelength of illumination light used may comprise either the same wavelength light as the exposure light or light of a wavelength different therefrom.

A fourth embodiment of the present invention will now be explained. FIG. 4 is a schematic view of a portion of a scanning exposure apparatus according to the fourth embodiment of the present invention.

As shown in FIG. 4, this embodiment is provided with half mirrors 105 and 107, a fiber 104, a condensing lens 102, and a light receiving element 103 which are disposed in a portion of a light path inside a microscope 7 of FIG. 1, and which are used for calibration. In this case, for calibration, the microscope 7 can be moved to a position above the mark 50 or 51. In this embodiment, operation may be made in accordance with the flow chart of FIG. 7.

A fifth embodiment of the present invention will now be explained. While in the first embodiment of FIG. 1, the plates 10 and 11 are mounted on the reticle stage 4, in this embodiment, a plate 100 is mounted on a wafer stage 5. The remaining portion of the basic structure of this embodiment is essentially the same as that of the first embodiment. As compared with the structure of FIG. 1, the structure of this embodiment differs from it in that the plates 10 and 11 are replaced by a reflection plate 12.

This embodiment is provided with a calibration detection system (102–106) such as shown in FIG. 3, which is disposed inside the wafer stage 5 placed below the plate 100. It serves to project light to the projection optical system 2, from the wafer stage 5 side.

In this case, reflection plates 120 and 121 are placed at the positions corresponding to the plates 10 and 11 of FIG. 1, for reflecting light from the projection optical system 2. The reflection surfaces of the reflection plates 120 and 121 are set at the same level (height) as the pattern surface of the reticle 1.

Figure 5:
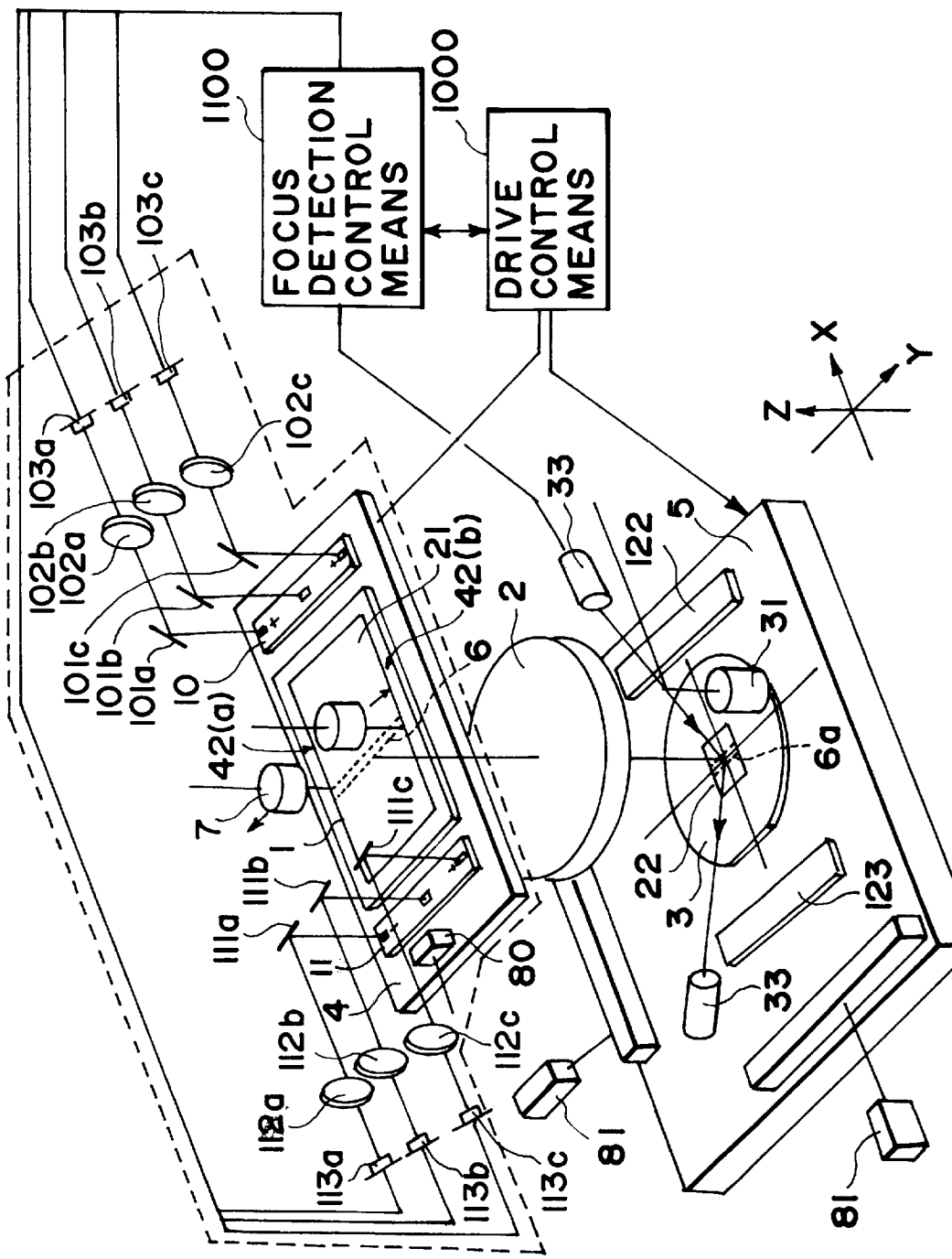
FIG. 5 is a schematic and diagrammatic view of a main portion of a scanning exposure apparatus according to a further embodiment of the present invention.

Next, a sixth embodiment of the present invention will be explained. FIG. 5 is a schematic view of a main portion of a scanning exposure apparatus according to the sixth embodiment of the present invention.

In this embodiment, two reflection plates 122 and 123 elongated in the same direction as the lengthwise direction of the slit-like shape of exposure light 6*a* are mounted on a wafer stage 5, and they are juxtaposed in the X direction as illustrated in which the wafer 3 is to be scanningly moved.

Here, the length of the reflection plates 122 and 123 in the Y direction is made longer than the diameter of the wafer 3. For calibration in the course of sequential operation of the pattern transfer process to the wafer, it can be performed only by scan movement of the wafer stage 5 as well as of the reticle stage 4. Thus, the throughput can be improved to the extent that movement of the wafer stage in the Y direction is unnecessary.

Either of the mark 50 or the mark 51 may be used for the calibration. Since, however, the position of the reticle stage 4 at the moment at which the calibration is just about to be performed may not always be at the drive center in the X direction, one of these marks which needs a smaller amount of X-direction movement of the reticle stage 4 may be used for the calibration. Also, as regards the reflection plates 122 and 123 on the wafer stage 5, one of them which needs a smaller amount of X-direction movement, that is, one of the reflection plates which is closer to the optical axis of the projection optical system may be used to perform the calibration.

A seventh embodiment of the present invention will now be explained. The first, second and sixth embodiments described above use the "self-conjunction method" for detection of the best imaging plane. In this embodiment, as compared, what can be called an "image sharpness method" is used wherein sharpness of an image of a mark on a wafer stage is measured. This embodiment differs from the first, second and sixth embodiments in this point, and the remaining portion of the basic structure is substantially the same as those of them.

The basic structure of this embodiment is similar to that shown in FIG. 1 or 5 but, in this embodiment, three structural components of FIG. 1 or 5, that is, light receiving systems 100 (100*a*–100*c*) and 110 (110*a*–110*c*), reference plates 10 and 11, and reflection surface plates 12 (or 120 or 121), are modified to enable measurement of sharpness of the image of a mark. Modifications will be explained below.

First, modifications to the light receiving systems 100 (100*a*–100*c*) and 110 (110*a*–110*c*) will be explained. In the structure of light receiving systems 100 and 110, the plane of marks 50 (50a–50c) and 51 (51a–51c) of the reference plates 10 and 11 and the plane of the light receiving surfaces of the light receiving elements 103 (103a–103c) and 113 (113a–113c) are arranged into an optically conjugate relation with each other with respect to the condensing lenses 102 (102a–102c) and 112 (112a–112c). Additionally, the light receiving elements 103 and 113 each is provided by an image detectable light receiving element such as a CCD camera, for example.

Figure 11:
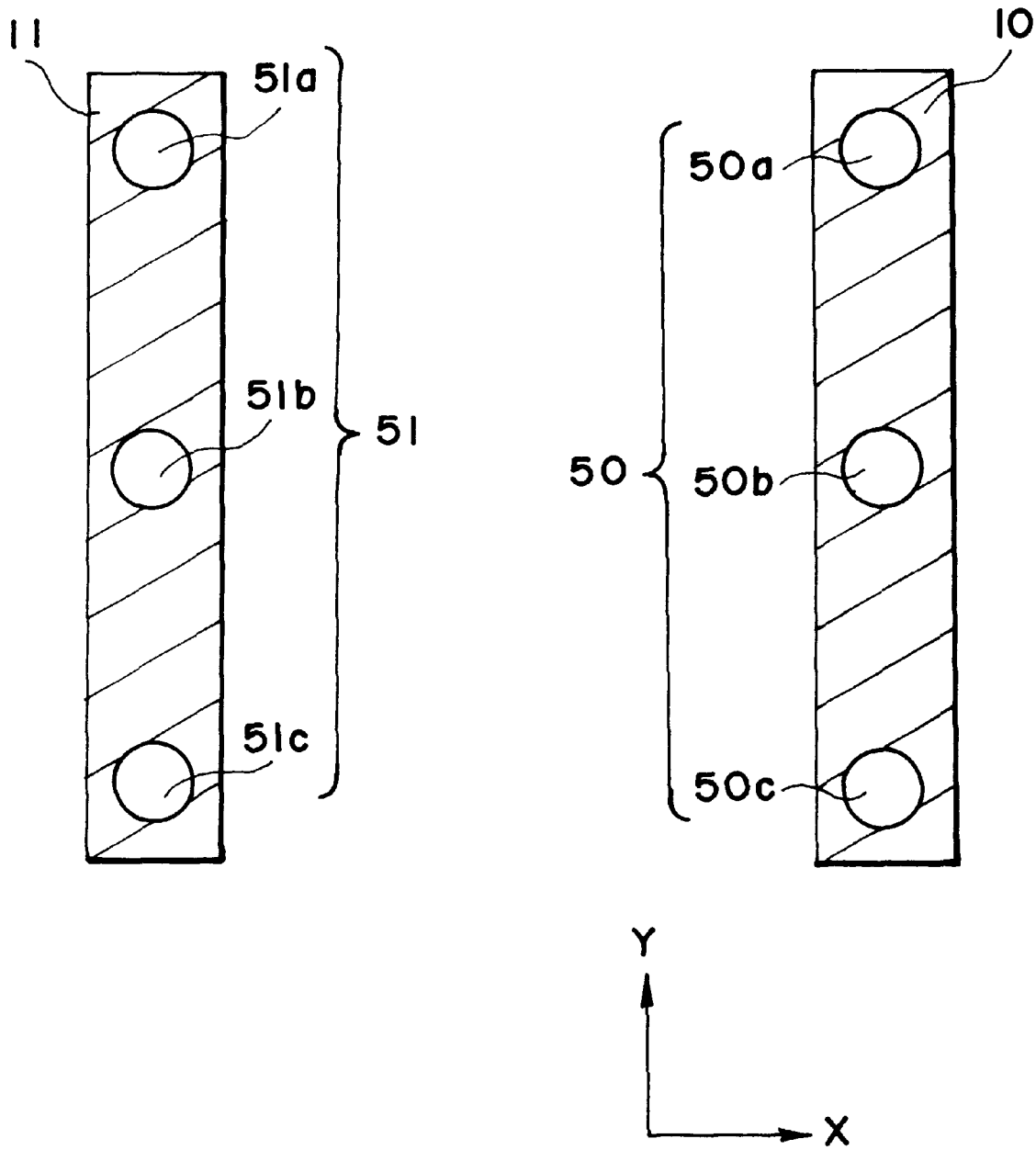
FIG. 11 is a schematic view for explaining a reference surface plate in an embodiment of the present invention.

Next, modifications to the reference plates 10 and 11 will be explained. The reference plates 10 and 11 on the reticle stage 4 have to be equipped with a transmissive portion, for measurement of sharpness of an image of the mark on the wafer stage 5. Thus, as shown in FIG. 11, marks 50 (50a–50c) and 51 (51a–51c) which comprise transmissive portions simply are provided on the reference plates 50 and 51, respectively, at different positions with respect to the Y direction. Here, the reference plate may be one having transmissivity over the whole surface thereof, but, for suppressing a variation during calibration due to absorption of the energy of the detection light applied to the projection optical system, preferably transmissive portions of a least number required may be defined as illustrated in FIG. 11.

The marks 50 (50a–50c) and 51 (51a–51c) on the reference plates 10 and 11 are set at substantially the same level (height) with respect to the optical axis direction of the projection optical system, as the plane in which the circuit pattern of the reticle 1 is present, this being made appropriately by setting the thickness of the reference plates 10 and 11.

Next, modifications to the reflection surface plate 12 (or 120 or 121) will be explained. The reflection surface plate 12 (or 120 or 121) mounted on the wafer stage 5 is equipped with an additional mark for image detection.

Figures 12, 13:
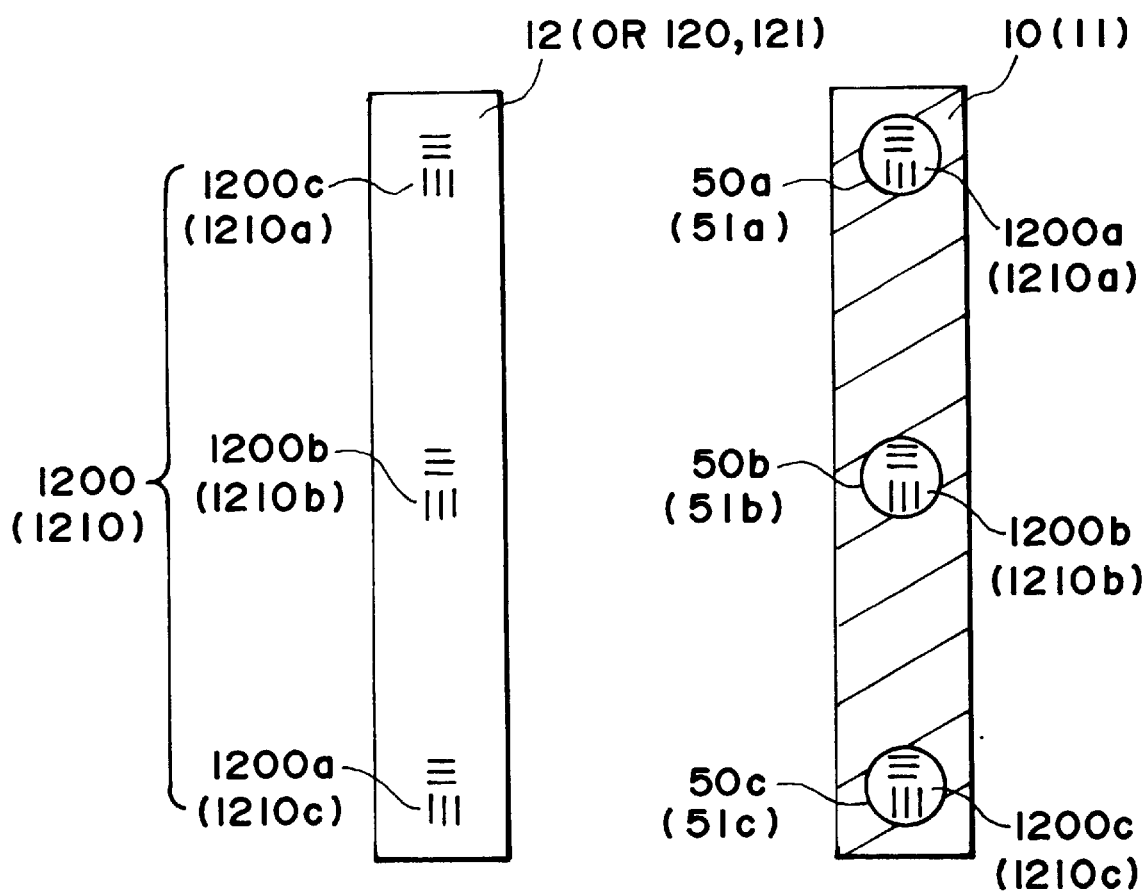
FIG. 12 is a schematic view for explaining a reflection surface plate in an embodiment of the present invention.
FIG. 13 is a schematic view for explaining a reference surface plate and a reflection surface plate, in an embodiment of the present invention.

FIG. 12 shows a mark formed on the reflection surface plate 12 on the wafer stage, in this embodiment of the present invention. As shown in FIG. 12, marks 1200 (1200a–1200c) or marks 1210 (1210a–1210c) are formed on the reflection surface plate 12 (or 120 or 121), at different positions with respect to the Y direction.

The mark 1200 or 1210 is provided by a pattern formed on a glass substrate by use of Cr deposition, for example. This pattern may comprise either a positive pattern or a negative pattern.

The mark 1200 of the reflection surface plate 12 (or 120 or 121) shown in FIG. 12 is present on a plane which is at substantially the same level as the surface of the wafer 3.

FIG. 13 is a schematic view of the reference plate 10 or 11, as viewed from above, in an example wherein, with the three points of modifications described above, the reference plate 10 or 11, and the reflection surface plate 12 (or 120 or 121) are moved into the exposure region of the projection optical system 2 and are placed at positions substantially optically conjugate with each other with respect to the projection optical system 2.

As shown in FIG. 13, through the marks 50 (50a–50c) or 51 (51a–51c) of the reference plate 50 or 51, which are transmissive portions, the marks 1200 (1200a–1200c) or 1210 (1210a–1210c) of the reflection surface plate 12 (or 120 or 121) are superposed.

On an occasion when the light receiving systems 100a–100c (or 110a–110c) are provided in association with these marks, respectively, solid-line zones 101a–101c (or 110a–110c) in FIG. 13 depict the regions where image observation is performed through the light receiving systems 100a–100c (or 110a–110c).

In FIG. 13, the mark 1200 (1200a–1200c) or 1210 (1210a–1210c) of the reflection surface plate 12 (or 120 or 121) is illustrated in a vertically inverted state as compared with that shown in FIG. 12. This is because the observation is made through the projection optical system 2 and the like.

On an occasion when a single light receiving system 100 (or 110) is provided in relation to the reference plate 10 (or 11), the single light receiving system may be moved to be opposed to each region 1010a–1010c (or 1100a–1100c) to perform image observation to those regions 1010a–1010c (or 1100a–1100c).

The process of calibration in this embodiment may be the same as shown in FIG. 6 or 7. The image may be memorized in the form of outputs of light receiving elements, and the best imaging position may be determined on the basis of the image sharpness method.

Now, the process of determining the best imaging position on the basis of image detection will be explained, while taking an example where the light receiving system 100a of FIG. 1 is used.

First, an illumination system (not shown) illuminates a mark 50a (transmissive portion) of the reference plate. Light passing through the mark 50a (transmissive portion) goes through the projection optical system 2 and, after that, it is collected on a mark 1200a (FIG. 12) on the reflection surface plate 12 and illuminates the same. Light reflected by the mark 1200a on the reflection surface plate 12 goes again through the projection optical system 2 and it is collected on the mark 50a (transmissive portion), whereby an image of the mark 1200a of the reflection surface plate 12 is formed. In this state, the region 1210a shown in FIG. 13 is under observation.

Further, the light passing through the mark 50a (transmissive portion) is reflected by a half mirror 101a and, after that, it goes through a condensing lens 102a and impinges on a light receiving element 103a for image detection. Thus, an image of the mark 1200a of the reflection surface plate 12 is formed again thereon.

In this state, the wafer stage 5 is moved in the Z direction (optical axis direction) of the projection optical system 2. The position in the Z direction, where the sharpness of the image of the mark 1200a of the reflection surface plate 12 obtainable from the light receiving element 103a becomes highest, corresponds to the best imaging position for the mark 50a.

Except for the manner of detection of the best imaging position as described above, this embodiment of the present invention is basically the same as the first, second and sixth embodiments. Therefore, further description thereof will be omitted here.

Next, an eighth embodiment of the present invention will be explained. The third embodiment described hereinbefore uses the "self-conjugation method" for detection of the best imaging plane. As compared, this embodiment uses an "image sharpness method". This embodiment differs from the third embodiment in that point, and the remaining portion of the structure is substantially the same as that of it.

While, as described, the basic structure of this embodiment is essentially the same as that of the third embodiment, the three structural components of the third embodiment, that is, light receiving systems 100 and 110, reference plates 10 and 11 and reflection surface plate 12 (or 120 or 121) are modified in this embodiment.

First, modifications to the light receiving systems 100 and 110 will be explained. In FIG. 3, the plane in which the mark 50 of the reference plate 10 is present and the plane of the light receiving surface of the light receiving element 103 are brought into an optically conjugate relation with each other with respect to the condensing lens 102. Additionally, the light receiving element 103 is provided by an image detectable light receiving element such as a CCD camera, for example. The second and third points of modifications are similar to those of the seventh embodiment described hereinbefore, and further description will be omitted. The remaining portion of this embodiment is essentially the same as that of the third embodiment.

Next, a ninth embodiment of the present invention will be explained. The fourth embodiment described hereinbefore uses "self-conjugation method" for detection of the best imaging plane. As compared, this embodiment differs from the fourth embodiment in that it uses the "image sharpness method". The remaining structure of this embodiment is substantially the same as that of the fourth embodiment.

While the basic structure of this embodiment is the same as that of the fourth embodiment, three structural components of the fourth embodiment, that is, light receiving system 100 and 110, reference plates 10 and 11, and reflection surface plate 12 (or 120 or 121) are modified in this embodiment.

First, modifications to the light receiving systems 100 and 110 will be explained. In FIG. 4, the plane in which the mark 50 of the reference plate 10 is present and the plane of the light receiving surface of the light receiving element 103 are brought into an optically conjugate relation with each other with respect to the condensing lens 102. Additionally, the light receiving element 103 is provided by an image detectable light receiving element such as a CCD camera, for example.

On an occasion when an image detectable element for detection of the pattern of a reticle is provided within the microscope, such an element may be used for the calibration detection.

The second and third points of modifications, that is, modifications to the reference plates 10 and 11 and the reflection surface plate 12 (or 120 or 121) are similar to those of the seventh embodiment described hereinbefore, and further description will be omitted. The remaining portion of this embodiment is essentially the same as that of the fourth embodiment.

Next, a tenth embodiment of the present invention will be explained. The fifth embodiment described hereinbefore uses the "self-conjugation method" for detection of the best imaging plane. As compared, this embodiment differs from the fifth embodiment in that it uses the "image sharpness method". The remaining structure of this embodiment is substantially the same as that of the fifth embodiment. While the basic structure of this embodiment is the same as that of the fifth embodiment, three structural components of the fifth embodiment, that is, light receiving system 100 and 110, reference plates 10 and 11, and reflection surface plate 12 (or 120 or 121) are modified in this embodiment. Since modifications are similar to those of the seventh or eighth embodiment described hereinbefore, further description will be omitted. The remaining portion of this embodiment is essentially the same as that of the fifth embodiment.

Next, an eleventh embodiment of the present invention will be explained. This embodiment differs from the preceding embodiments in the point of the calibration process for a case wherein there is a positional deviation between the best imaging position of a light receiving system used for calibration detection and the best imaging position, for a circuit pattern, of a projection optical system.

In the seventh to tenth embodiments, there are two positions defined which are optically conjugate with the light receiving surface of the light receiving element 103 (or 113): that is, a position intermediate between the condensing lens 102 (or 112) and the projection optical system 2, and a position on the plane of the reflection surface plate 12 (or 120 or 121) on which the mark 1200 (or 1210) is present.

In the seventh to tenth embodiments, the position which is intermediate between the condensing lens 102 (or 112) and the projection optical system 2 and which is optically conjugate with the light receiving surface of the light receiving element 103 (or 113), is registered with the plane on which the mark 50 (or 51) of the reference plate 10 (or 11) is present.

Here, since the plane on which the mark 50 (or 51) of the reference plate 10 (or 11) is present is disposed substantially at the same level as the plane on which the circuit pattern of the reticle 1 is present, the best imaging position for the image of the mark 1200 (or 1210) to be detected through the light receiving element 103 is in agreement with the best imaging position for imaging the circuit pattern of the reticle 1 through the projection optical system 2.

As compared, this embodiment is effective to operate in the following two cases.

1) A case wherein the plane on which the mark 50 (or 51) of the reference plate 10 (or 11) deviates from the plane on which the circuit pattern of the reticle 1 is present; and 2) A case wherein the position which is optically conjugate with the light receiving surface of the light receiving element 103 (or 113) deviates from the plane on which the mark 50 (or 51) of the reference plate 10 (or 11) is present.

On an occasion case of 1) or case 2), or on an occasion where both cases 1) and 2) are involved, the best imaging position determined by the image of the mark 1200 (or 1210) detected by the light receiving element 103 involves a deviation with respect to the position where the circuit pattern of the reticle 1 is best imaged by the projection optical system 2.

As long as the relative positional relation of the reference plate 10 (or 11) and the light receiving system 100 (or 110) relative to the reticle stage 4, on which these components are mounted, is held constant, the amount of such deviation is predetermined. Thus, it can be corrected as an offset.

Figure 17:
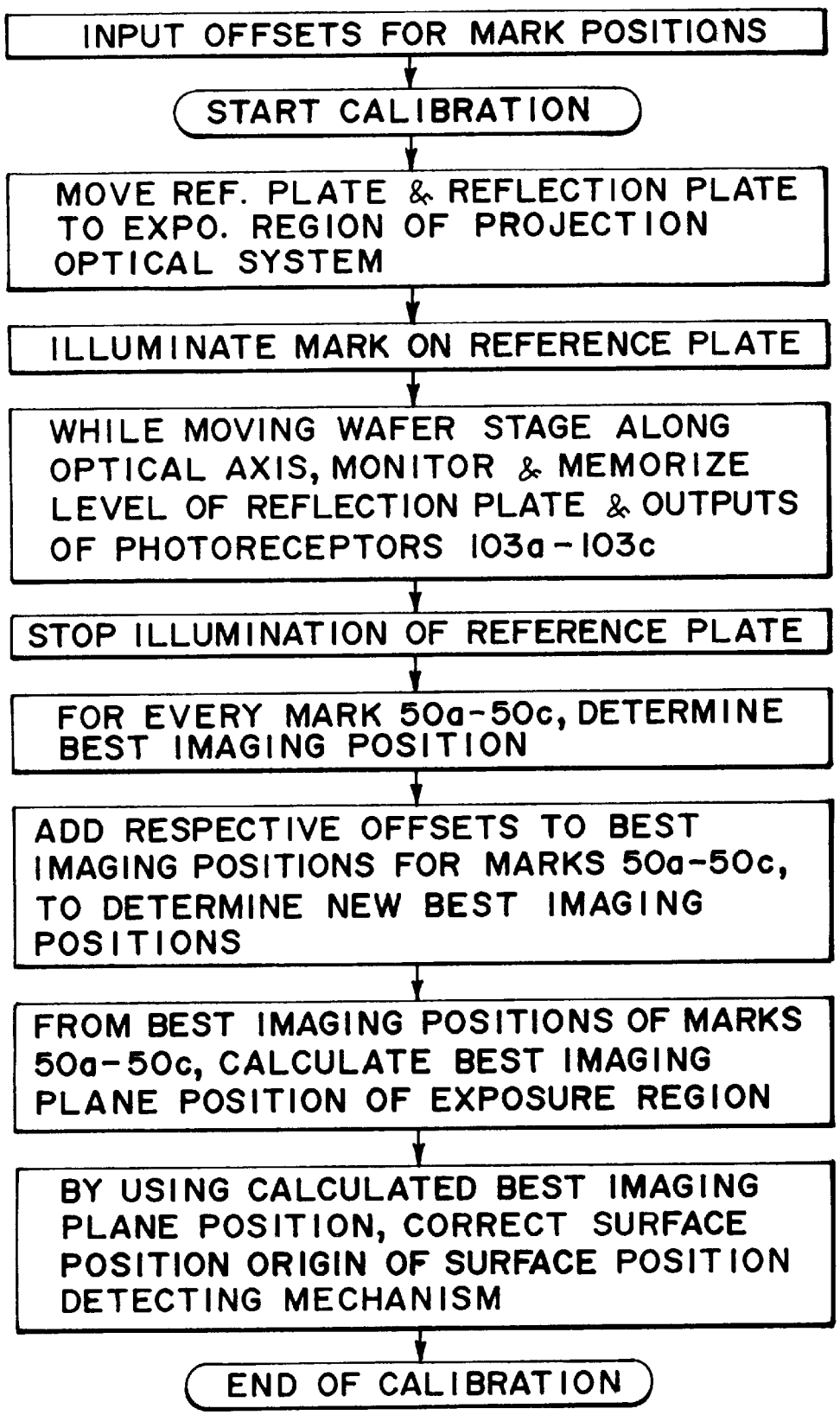
FIG. 17 is a flow chart for explaining operation in an embodiment of the present invention.
Figure 18:
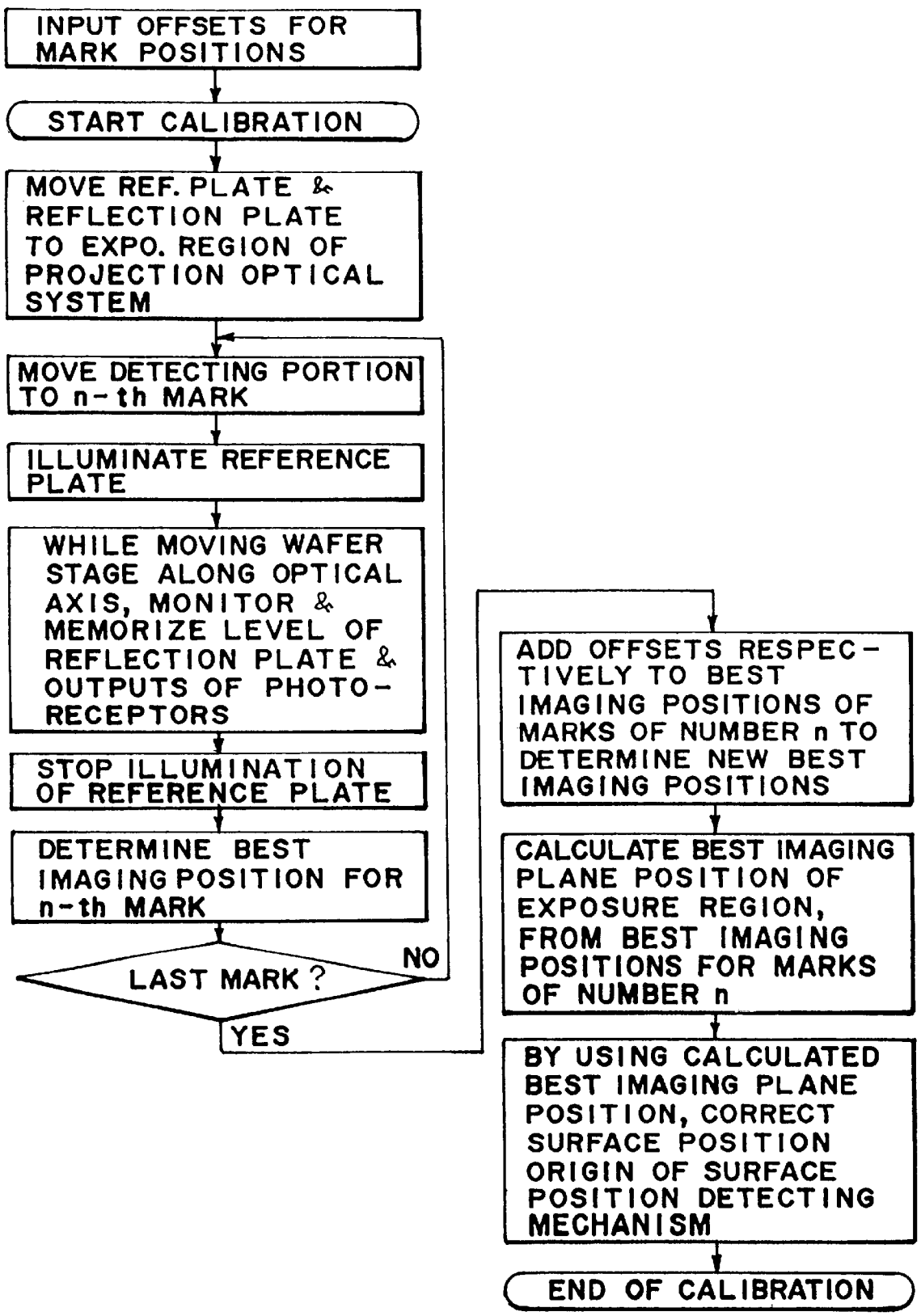
FIG. 18 is a flow chart for explaining operation in an embodiment of the present invention.

FIGS. 17 and 18 each shows a flow chart for such offset correction. First, the result of measurement of the best imaging position for the images of the marks 50a–50c (or 51a–51c) of the reference plate 10 (or 11) and the result of printing the circuit pattern of the reticle 1 at image heights corresponding to the respective mark positions, are compared with each other, whereby deviations such as described above with respect to these mark positions are measured beforehand.

The thus measured deviations at the respective mark positions are inputted through a console of a projection exposure apparatus, not shown, and they are memorized into a storing means inside the focal point position detection control means 1100 as offset. It may be sufficient that such offset setting is done once before shipment of the apparatus. If the offset varies with time, the offset may be reset periodically.

Calibration is performed in this state. Now, modified portions of the flow chart of FIG. 6 or 7 will be explained. Deviation amounts related to the respective mark positions as memorized in the storing means of the focal point position detection control means 1100 are added to the best imaging positions, as offset, which are determined in relation to the marks, respectively. Then, the best imaging position of the exposure region is calculated, from the best imaging positions of the marks as offset corrected.

Next, a twelfth embodiment of the present invention will be explained. In this embodiment, if the light receiving system for image detection varies with time, changes in this light receiving system are corrected. The calibration process for this will be explained below.

In the seventh to eleventh embodiments, calibration detection is performed on an assumption that the imaging state of the light receiving systems 100 (100a–100c) and 110 (110a–110c) does not change.

Since, however, the light receiving systems 100 and 110 comprise a plurality of elements, there is a possibility that during a long term the imaging state thereof varies with time. On that occasion, there occurs a change with time in the position for calibration of the best imaging plane position of the projection optical system.

In order to avoid an error due to variation with time in the imaging state of the light receiving system 100 or 110, in the seventh to eleventh embodiments, calibration is performed after the imaging position of the light receiving system 100 or 110 is brought into alignment with a particular position.

In this embodiment, modifications are made to two structural components of the seventh to eleventh embodiments, that is, light receiving system 100 (100a–100c) or 110 (110a–110c) and reference plate 10 or 11, as follows.

Figure 14:
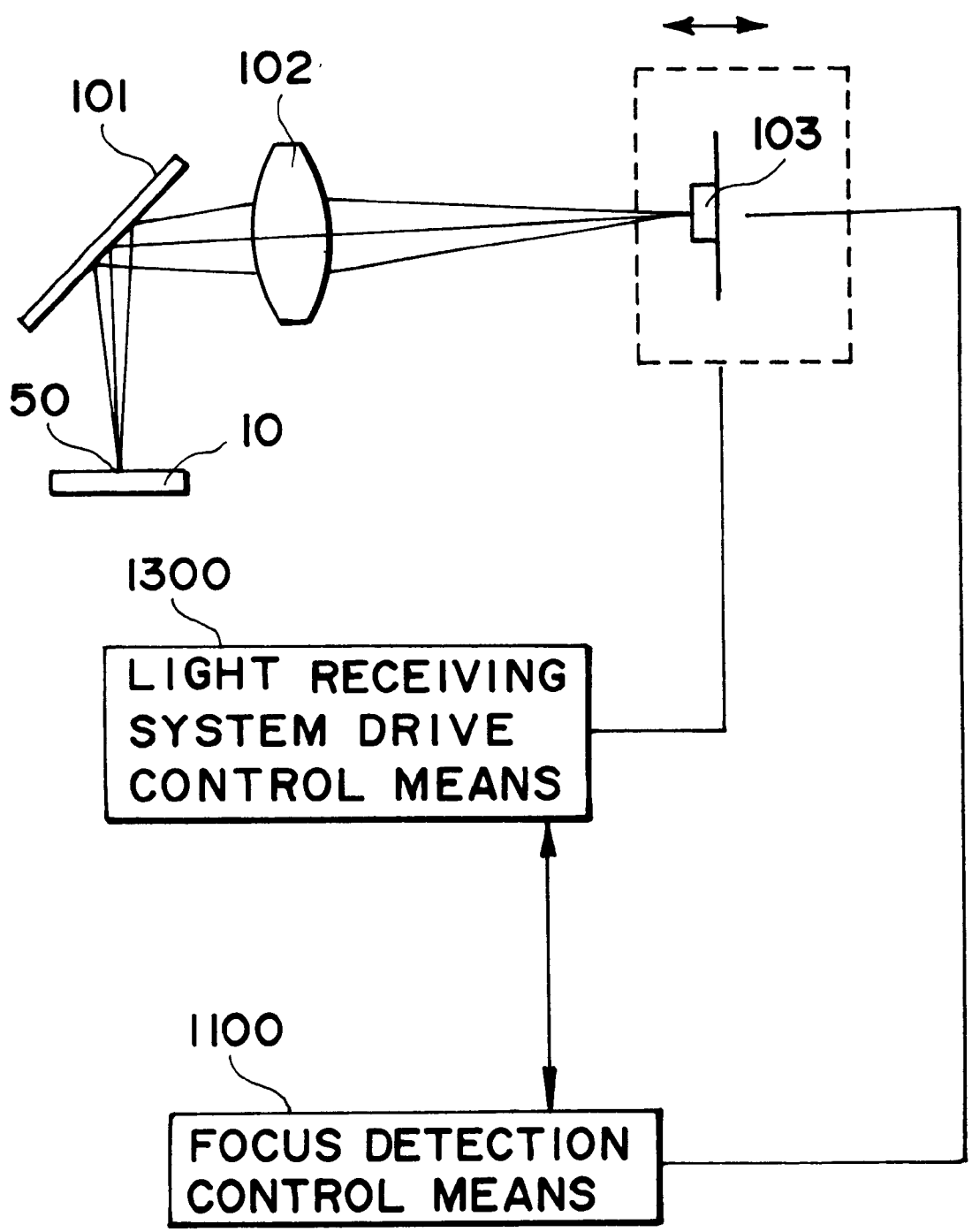
FIG. 14 is a schematic and diagrammatic view for explaining a portion of a scanning exposure apparatus according to an embodiment of the present invention.

First, modifications to the light receiving system 100 or 110 will be explained. As shown in FIG. 14, the light receiving system 100 is arranged so that the imaging position with respect to the optical axis direction can be adjusted by light receiving system drive control means 1300. Here, only the light receiving system 100 is illustrated, for simplicity of illustration. However, the same applies to the remaining light receiving systems 100a–100c and 110a–110c.

For adjustment of the imaging position, the light receiving element 103 which comprises an image detecting element is moved in the optical axis direction, and an image of a focusing mark provided on the reference plate (to be described later) is observed. Then, on the basis of the sharpness of this image, the focus position of the light receiving system 100 is detected. Here, regarding adjustment of the imaging position, as an example, the condensing lens may be moved along the optical axis direction or, alternatively, the light receiving system as a whole may be moved.

Figure 15:
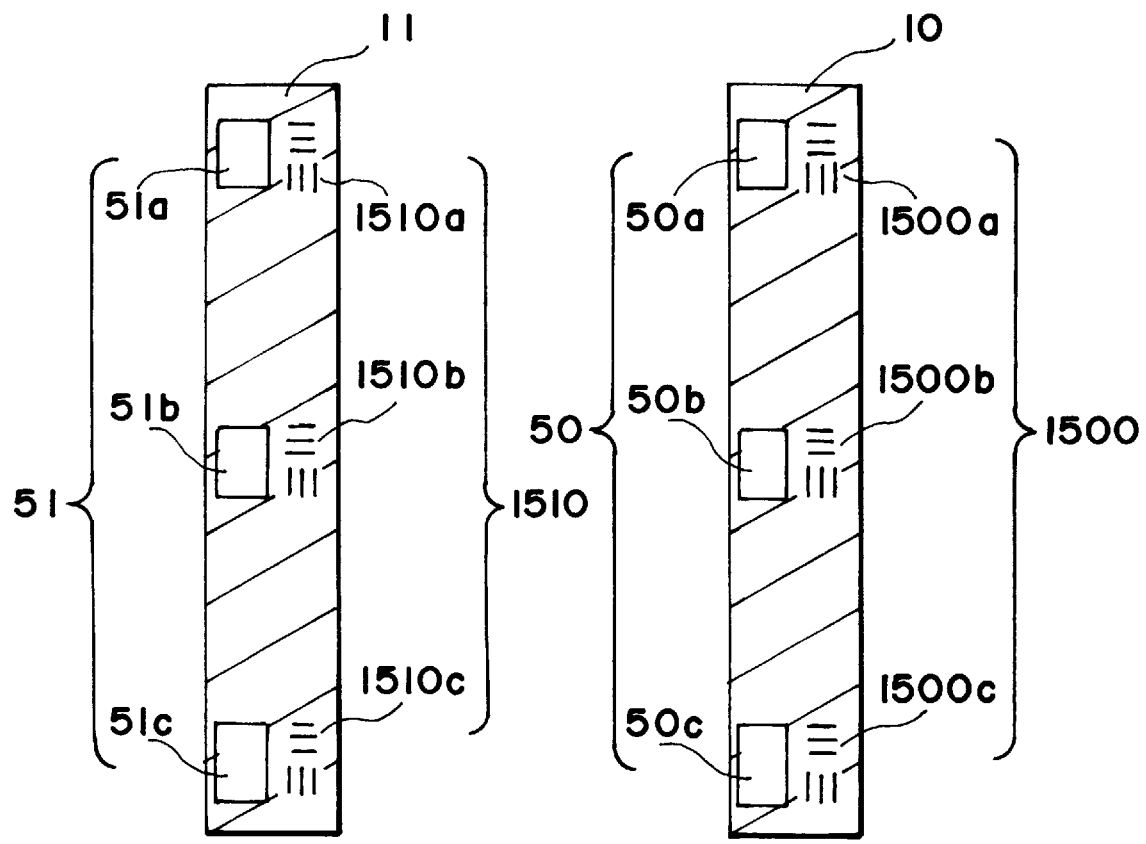
FIG. 15 is a schematic view for explaining a reference plate in an embodiment of the present invention.

Next, modifications to the reference plates 10 and 11 will be explained. FIG. 15 illustrates marks 50 and 51 as well as marks 1500 and 1510 of the reference plates 10 and 11. Denoted at 10 and 11 in this drawing are the reference plates which are mounted on the reticle stage 4. The marks 50 (50a–50c) and 51 (51a–51c) comprise transmissive apertures to be used for calibration of the projection optical system 2. Adjacent to these marks 50 and 51, there are focus detection marks 1500 (1500a–1500c) and 1510 (1510a–1510c) for the light receiving systems 100 (100a–100c) and 110 (110a–110c).

Figure 16:
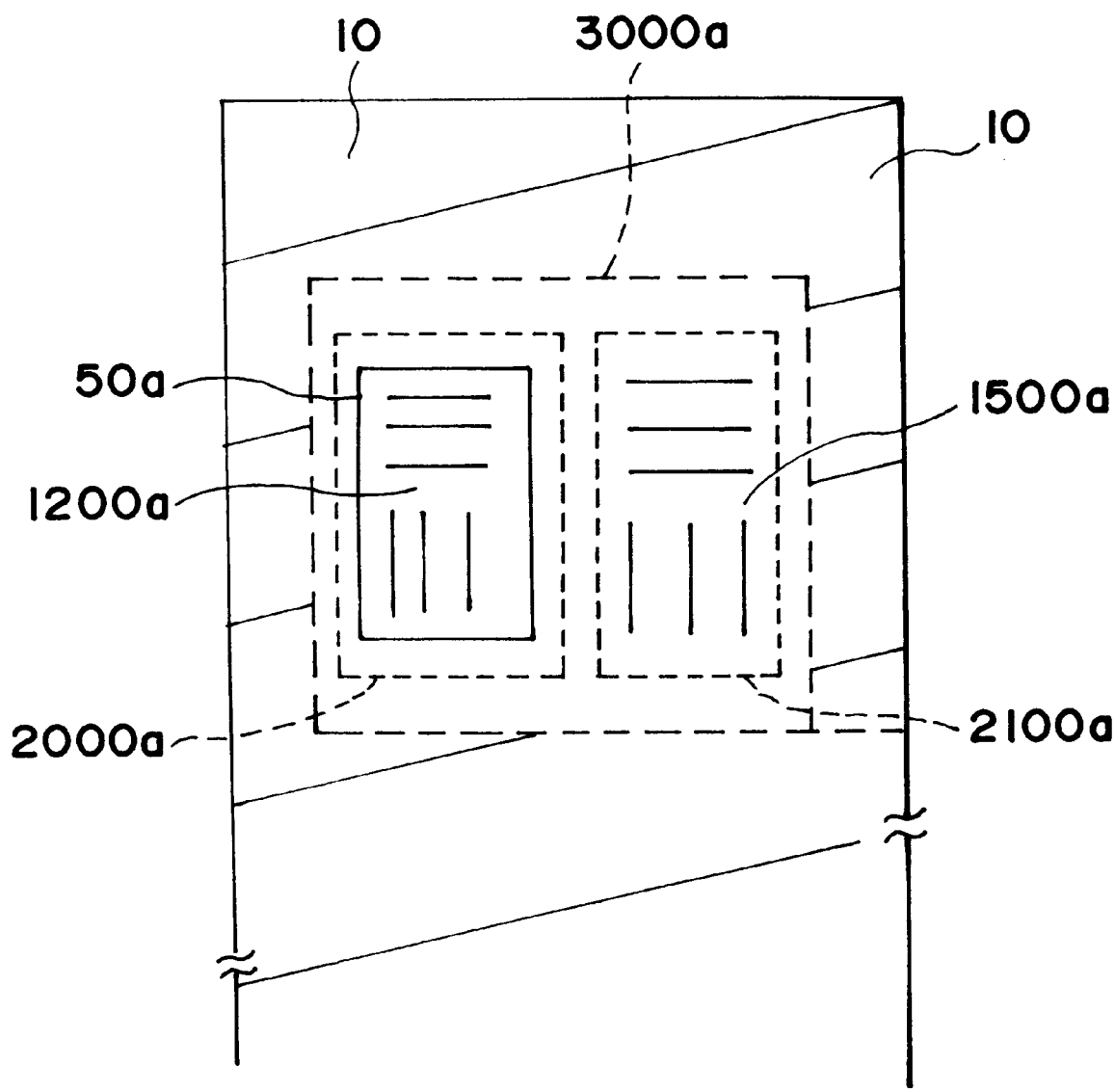
FIG. 16 is a schematic view for explaining a light receiving system in an embodiment of the present invention.

Referring to FIG. 16 and while taking the light receiving system 100a as an example, an image observation region 3000a and image detection regions 200a and 2100a will be explained. The image observation region 3000a has a size sufficient to observe both a transmissive mark 50a for calibration and a light receiving system focus detection mark 1500a simultaneously. This image observation region 3000a comprises two separate image detection regions 2000a and 2100a.

The term "image observation region" corresponds to the viewfield of the light receiving system 100a, and the term "image detection region" refers to the range in which image processing is performed to a particular region within this viewfield.

The light receiving system 100a operates, for calibration of the projection optical system 2, to perform, within the image detection region 2000a, image processing to the mark 1200a (FIG. 12) of the reflection surface plate 12 as observed through the mark 50a (transmissive opening).

Also, the light receiving system 100a operates, for adjustment of the imaging position of the light receiving system 100a, to perform, within the image detection region 2100a, image processing to the mark 1500a of the reference plate 10 or 11.

Figure 19:
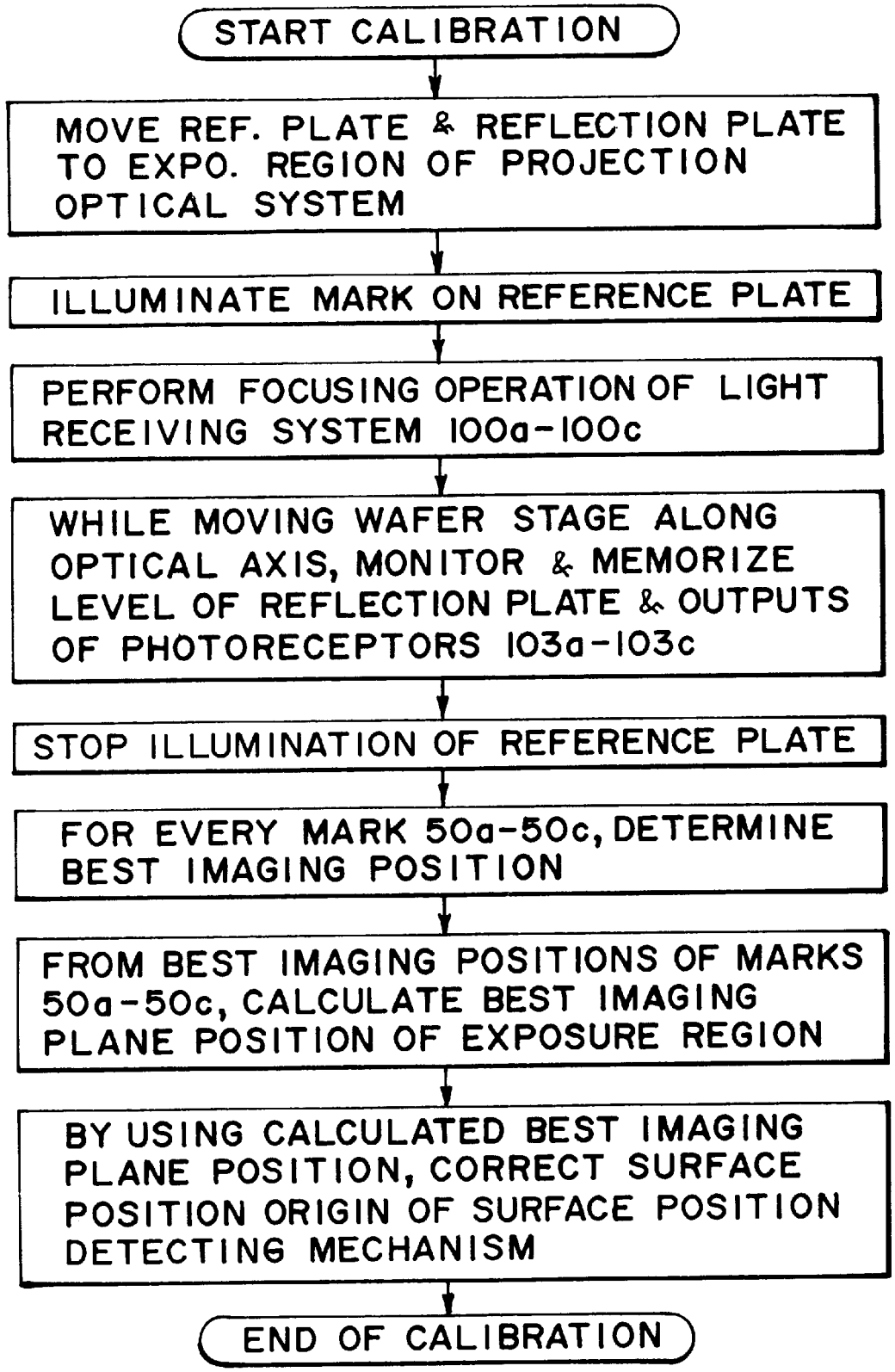
FIG. 19 is a flow chart for explaining operation in an embodiment of the present invention.
Figure 20:
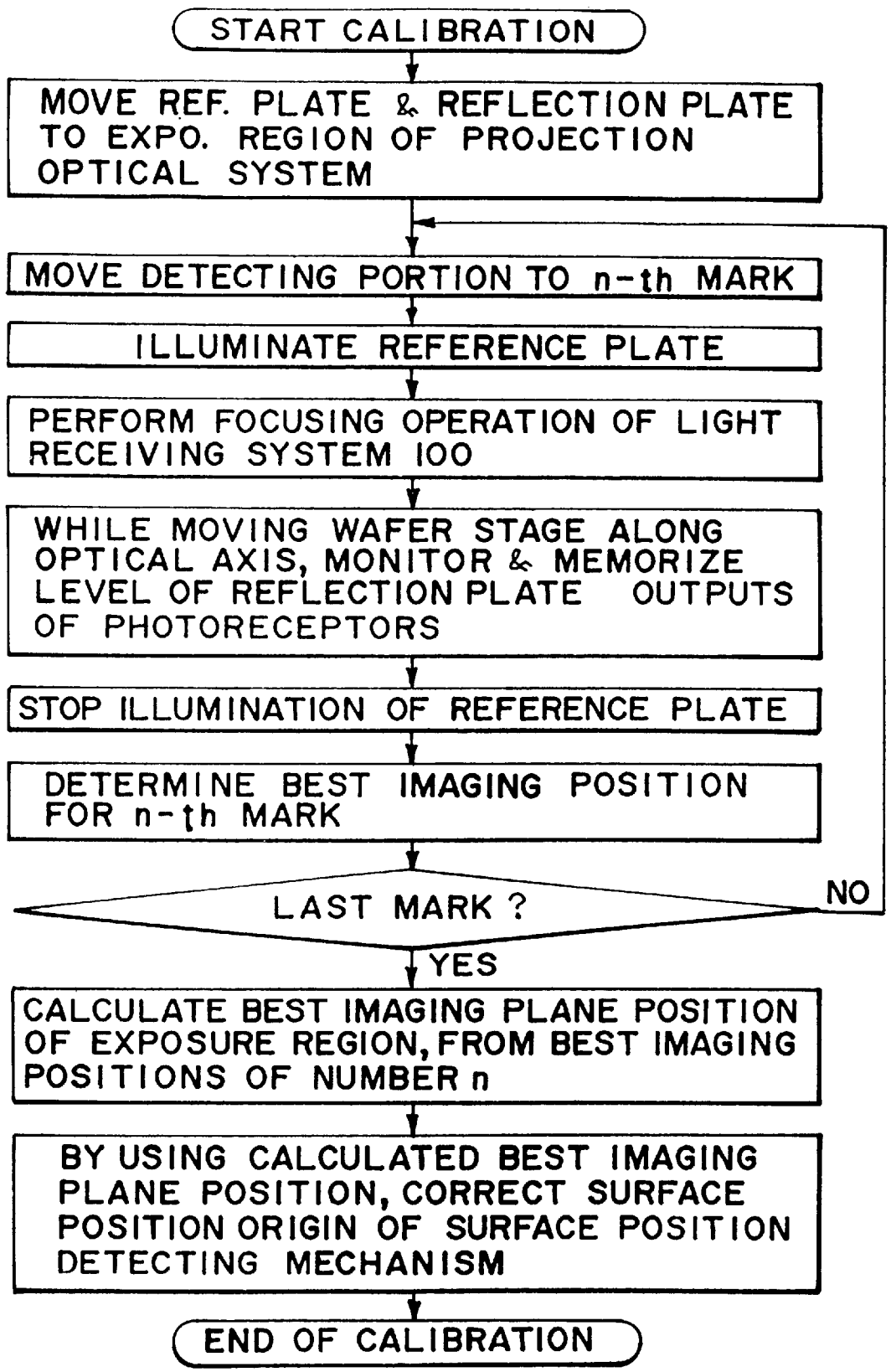
FIG. 20 is a flow chart for explaining operation in another embodiment of the present invention.
Figure 21:
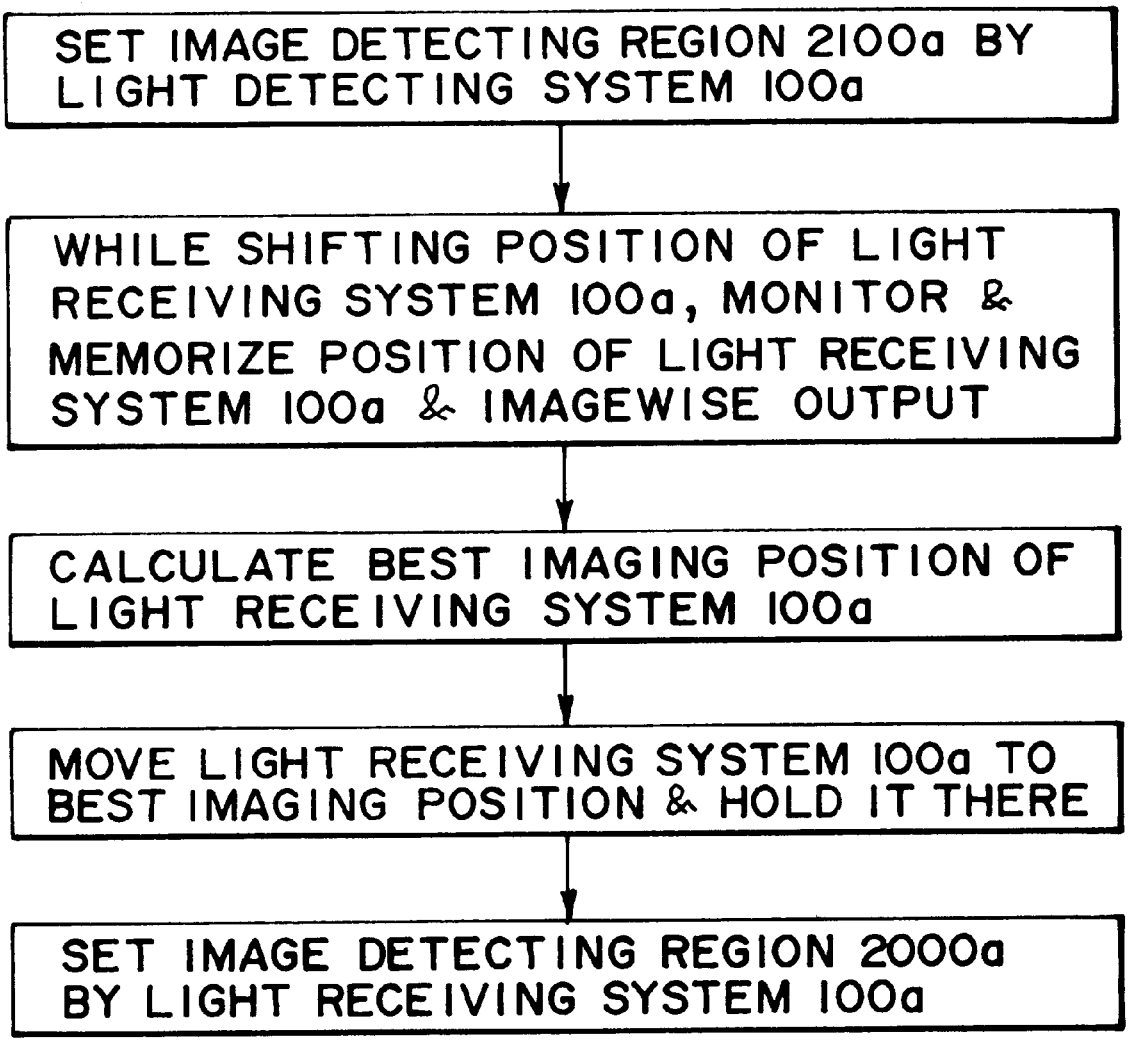
FIG. 21 is a flow chart for explaining operation in an embodiment of the present invention.

FIGS. 19, 20 and 21 are flow charts according to this embodiment. FIG. 19 corresponds to a case where, in the structure of the seventh embodiment, a total of six light receiving systems 100a–100c and 110a–110c are provided in association with the marks on the reference surface plates 10 and 11.

FIG. 20 corresponds to a case where, in the structure of the seventh embodiment, two light receiving systems 100 and 110 are provided in association with the reference surface plates 10 and 11.

In these cases, focusing operation of the light receiving system is performed just before monitoring of the output of the light receiving elements while moving the wafer stage in the optical axis direction. The remaining portion of the structure and operation is substantially the same as that of the seventh embodiment, and a description therefor will be omitted.

FIG. 21 is a flow chart showing details of the focusing operation of the light receiving system, included in the flow charts of FIGS. 19 and 20. At the stage whereat the focusing operation of the light receiving system is executed in accordance with the flow chart of FIG. 19 or 20, marks of the reference plate and the reflection surface plate can be observed within the image observation region of the light receiving system, such as illustrated in FIG. 16.

While taking the light receiving system 100a of FIG. 16 as an example, explanation will be made below. First, the detection region of the light receiving system 100a is set to the image detection region 2100. Then, while shifting the position of the light receiving system 110a along the optical axis direction by using the light receiving system drive control means 1300, positions of the light receiving system 100 in the optical axis direction and images of the mark 1500a of the reference plate as observed in the image detection region 2100, corresponding to varying positions of the light receiving system 100, are memorized into a memory.

Images produced in relation to the different positions are processed, and the imaging position of the light receiving system with which the sharpness of the image is highest, is calculated. The light receiving system 100 then shifts its imaging position with respect to the optical axis direction to the above-described position where the image sharpness is highest, and it is held fixed.

Finally, the detection region of the light receiving system 100 is set to the image detection region 2000. In this state, the image of the mark 1200a (FIG. 12) of the reflection surface plate as observed through the mark 50a (transmissive opening) can be observed.

Detection of the best imaging position for use in calibration, in the present invention, is not limited to the self-conjugation method or image sharpness method as described. Any procedure may be adopted, provided that it enables TTL detection wherein detection is performed through the projection optical system 2.

Next, an embodiment of a device manufacturing method which uses a projection exposure apparatus such as described above, will be explained.

Figure 8:
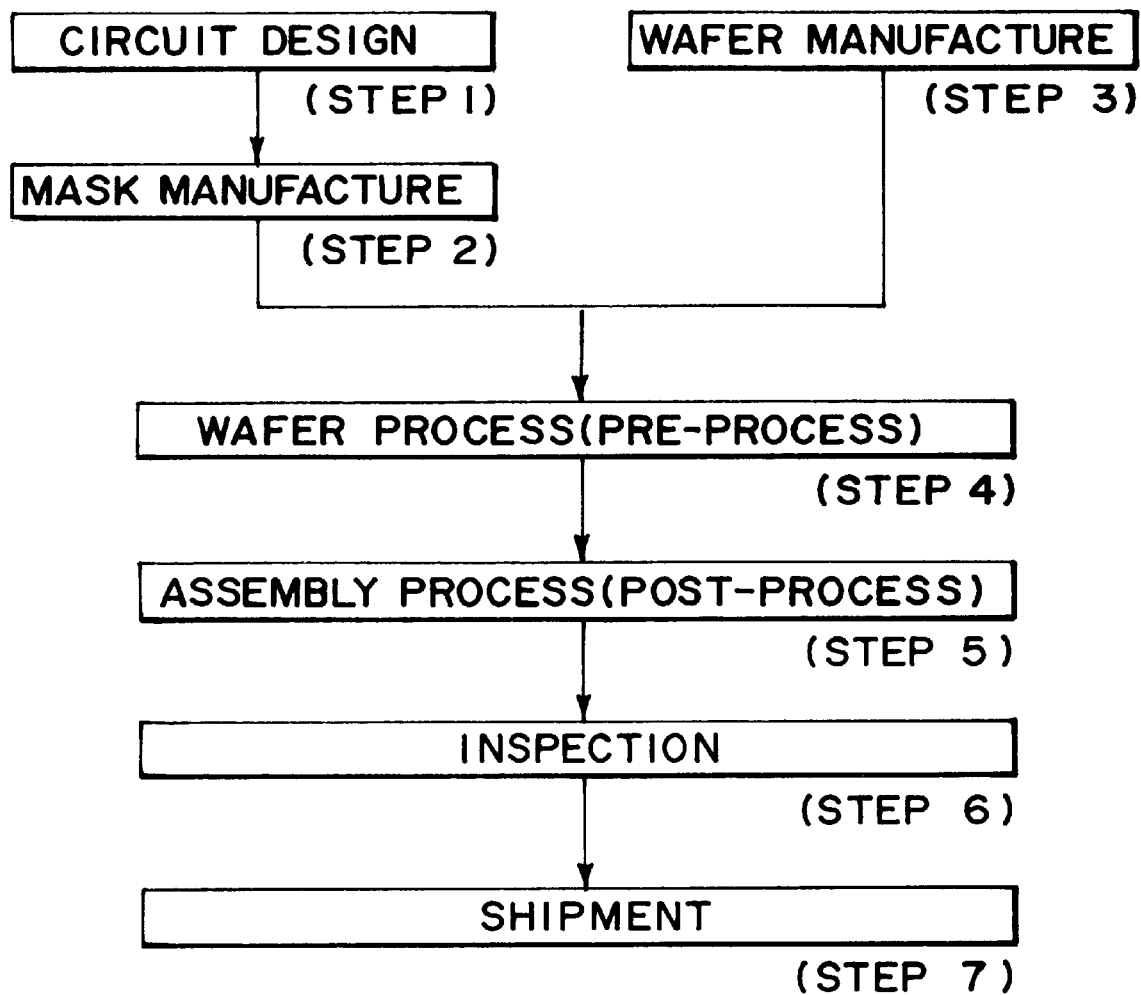
FIG. 8 is a flow chart for explaining device manufacturing processes, according to an embodiment of the present invention.

FIG. 8 is a flow chart of a procedure for the manufacture of microdevices such as semiconductor chips (e.g., ICs or LSIs), liquid crystal panels, or CCDs, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes assembling (dicing and bonding) processes and packaging (chip sealing) processes. Step 6 is an inspection step wherein a operation check, a durability check and so on for the semiconductor devices provided by step 5, are carried out. With these processes, semiconductor devices are completed and they are shipped (step 7).

Figure 9:
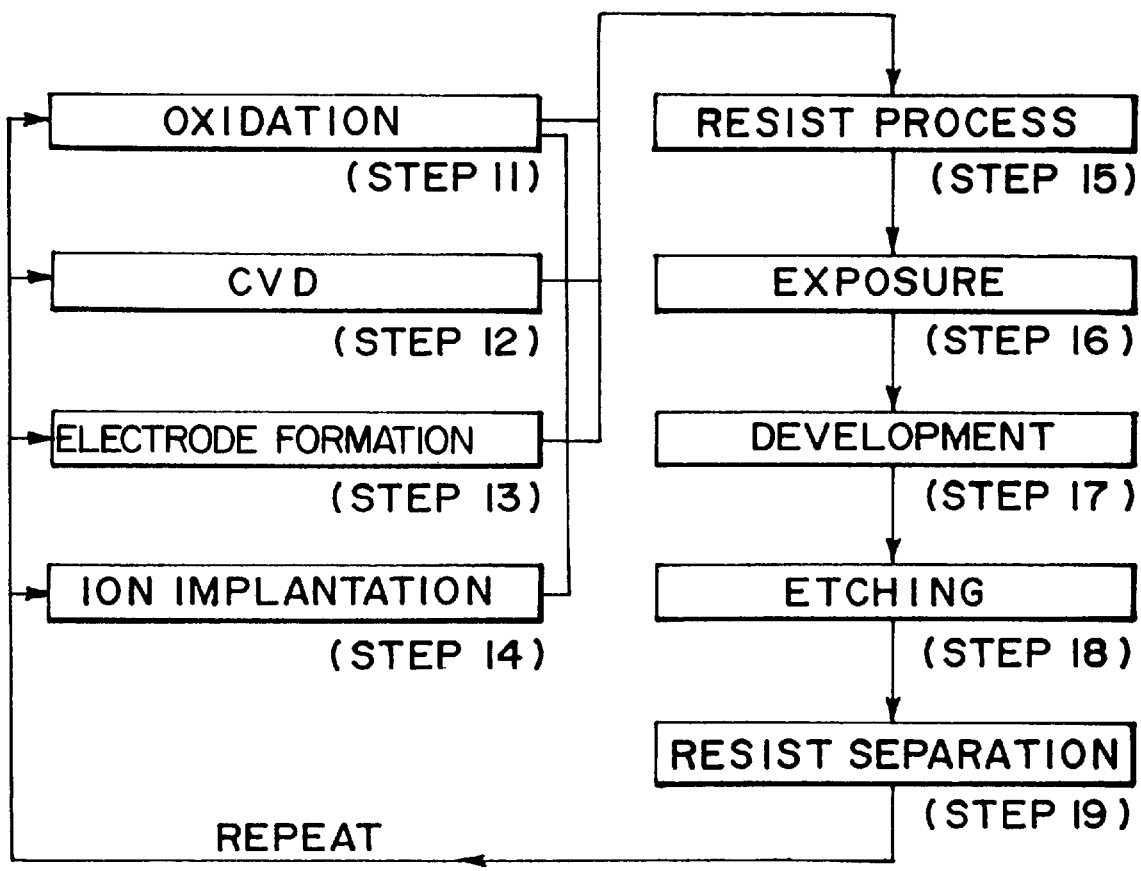
FIG. 9 is a flow chart for explaining one of device manufacturing processes, according to an embodiment of the present invention.

FIG. 9 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, the manufacture of high density microdevices is facilitated.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus, wherein a pattern of a surface of a first object placed on a first stage is illuminated with exposure light from a slit aperture of illumination means, and wherein the pattern of the first object is projected through a projection optical system onto a surface of a second object placed on a second stage while relatively and scanningly moving said first and second stages in a widthwise direction of the slit aperture, in a timed relation and at a speed ratio corresponding to a projection magnification of said projection optical system, said apparatus comprising:

a reference plate provided in a portion of one of said first and second stages and having a predetermined mark;

a reflection surface plate provided in a portion of the other of said first and second stages, and a surface position detecting system for projecting the mark of said reference plate onto said reflection surface plate through said projection optical system and, while moving one of said first and second stages in a direction of an optical axis, for detecting the position of the surface of the second object in the direction of the optical axis on the basis of an image reflected by said reflection surface plate.

2. An apparatus according to claim 1, wherein said apparatus is provided with a plurality of reference plates each as aforesaid, which are disposed in a scan direction of the first object on said first stage, and wherein said surface position detecting system detects the surface position of the second object in the optical axis direction on the basis of a reference plate, of said plural reference plates, closer to the optical axis of said projection optical system.

3. An apparatus according to claim 1, wherein said reference plate is formed with plural marks for surface position detection, which are disposed in a direction perpendicular to the scan direction.

4. An apparatus according to claim 1, wherein said apparatus is provided with a plurality of reflection surface plates each as aforesaid, and wherein said position detecting system detects the surface position of the second object on the basis of a reflection surface plate, of said plural reflection surface plates, closer to the optical axis of said projection optical system.

5. An apparatus according to claim 1, wherein said reflection surface plate is disposed in a portion of said second stage, and wherein said reflection surface plate has a length in a direction perpendicular to the scan direction, which is larger than a diameter of the surface of the second object on said second stage.

6. An apparatus according to claim 1, further comprising an off-axis surface position detecting system in which a pattern is projected, obliquely onto the surface of the second object, by means of a light projecting system and without use of said projection optical system, in which an image of the pattern formed on the surface of the second object is re-imaged by means of a light receiving system upon a surface of a light receiving element, and in which positional information related to the surface of the second object with respect to the optical axis direction is detected on the basis of a positional signal related to the image of the pattern re-imaged on said light receiving element surface, wherein said off-axis surface position detecting system performs calibration on the basis of data obtainable with the first-mentioned surface position detecting system.

7. A scanning exposure apparatus, wherein a pattern of a surface of a first object placed on a first stage is illuminated with exposure light from a slit aperture of illumination means, and wherein the pattern of the first object is projected through a projection optical system onto a surface of a second object placed on a second stage while relatively and scanningly moving said first and second stages in a widthwise direction of the slit aperture, in a timed relation and at a speed ratio corresponding to a projection magnification of said projection optical system, said apparatus comprising:

a reflection plate provided in a portion of one of said first and second stages and having a predetermined mark;

a reference surface plate provided in a portion of the other of said first and second stages, and a surface position detecting system for observing the mark of said reflection plate through said projection optical system and through a transparent portion of said reference plate, and, while moving one of said first and second stages in a direction of an optical axis, for detecting the position of the surface of the second object in the direction of the optical axis on the basis of an image of the mark of said reflection plate.

8. An apparatus according to claim 7, wherein said apparatus is provided with a plurality of reference plates each as aforesaid, which are disposed in a scan direction of the first object on said first stage, and wherein said surface position detecting system detects the surface position of the second object in the optical axis direction on the basis of a reference plate, of said plural reference plates, closer to the optical axis of said projection optical system.

9. An apparatus according to claim 7, wherein said reference plate is formed with plural marks for surface position detection, which are disposed in a direction perpendicular to the scan direction.

10. An apparatus according to claim 7, wherein said apparatus is provided with a plurality of reflection plates each as aforesaid, and wherein said position detecting system detects the surface position of the second object on the basis of a reflection plate, of said plural reflection plates, closer to the optical axis of said projection optical system.

11. An apparatus according to claim 7, wherein said reflection plate is disposed in a portion of said second stage, and wherein said reflection plate has a length in a direction perpendicular to the scan direction, which is larger than a diameter of the surface of the second object on said second stage.

12. An apparatus according to claim 7, further comprising an off-axis surface position detecting system in which a pattern is projected, obliquely onto the surface of the second object, by means of a light projecting system and without use of said projection optical system, in which an image of the pattern formed on the surface of the second object is re-imaged by means of a light receiving system upon a surface of a light receiving element, and in which positional information related to the surface of the second object with respect to the optical axis direction is detected on the basis of a positional signal related to the image of the pattern re-imaged on said light receiving element surface, wherein said off-axis surface position detecting system performs calibration on the basis of data obtainable with the first-mentioned surface position detecting system.

13. A scanning exposure apparatus for illuminating a pattern of a first object placed on a first stage with exposure light of a slit aperture from illumination means and for projecting, through a projection optical system, the pattern of the first object onto a second object placed on a second stage, while relatively scanningly moving the first and second stages along a widthwise direction of the slit aperture, in a timed relation and at a speed ratio corresponding to a projection magnification of the projection optical system, said apparatus comprising:

a reflection plate mounted on one of the first and second stages and having a first mark;

a reference plate mounted on the other of the first and second stages and having a transmissive portion and a second mark; and a surface position detecting system for observing the first mark of said reflection plate through the projection optical system and the transmissive portion of said reference plate, and for moving one of the first and second stages in an optical axis direction to determine the surface position of the second object on the basis of an image of the first mark of said reflection plate, said surface position detecting system performing focus adjustment by use of the second mark.

14. An apparatus according to claim 13, wherein said reflection plate has a plurality of the first marks arranged along a direction perpendicular to a direction of the scan.

15. An apparatus according to claim 13, further comprising an off-axis surface position detecting system in which a pattern is projected, obliquely onto the surface of the second object, by means of a light projecting system and without use of the projection optical system, in which an image of the pattern formed on the surface of the second object is re-imaged by means of a light receiving system upon a surface of a light receiving element, and in which positional information related to the surface of the second object with respect to the optical axis direction is detected on the basis of a positional signal related to the image of the pattern re-imaged on the light receiving element surface, wherein said off-axis surface position detecting system performs calibration on the basis of data obtainable with the first-mentioned surface position detecting system.

16. An apparatus according to claim 15, wherein said reflection plate has a plurality of the first marks arranged along a direction perpendicular to a direction of the scan.

* * * * *

UNITED STATES PATENT AND TRADEMARK OFFICE
CERTIFICATE OF CORRECTION

PATENT NO. : 6,023,320

DATED : February 8, 2000

INVENTOR(S) : HARUNA KAWASHIMA

It is certified that error appears in the above-identified patent and that said Letters Patent is hereby corrected as shown below:

COLUMN 7:
   Line 12, "51a-41c" should read --51a-51c--.
   Line 23, "110a)," should read --101a),--.
   Line 26, "10a-100c" should read --100a-100c--.
   Line 42, "Z" should read --the Z--.
   Line 47, "on to" should read --onto--.

COLUMN 8:
   Line 46, "yhe" should read --the--.

COLUMN 10:
   Line 49, " "self-conjunction" should read --"self-conjugation--.
   Line 54, "and" should read --but--. ( second occurence)
   Line 55, "same as" should read --same.--.
   Line 56, "those of them." should be deleted.

COLUMN 13:
   Line 13, "uses" should read --uses the--.

UNITED STATES PATENT AND TRADEMARK OFFICE
CERTIFICATE OF CORRECTION

PATENT NO. : 6,023,320

DATED : February 8, 2000

INVENTOR(S) : HARUNA KAWASHIMA

Page 2 of 2

It is certified that error appears in the above-identified patent and that said Letters Patent is hereby corrected as shown below:

COLUMN 16:
   Line 45, "110a" should read --100a--.

COLUMN 17:
   Line 65, "stages," should read --stages;--.

Signed and Sealed this

Sixth Day of February, 2001

Attest:

Q. TODD DICKINSON

Attesting Officer

Director of Patents and Trademarks